US012813350B2

(12) United States Patent
Watanabe et al.

(10) Patent No.: US 12,813,350 B2
(45) Date of Patent: Nov. 24, 2026

(54) LIGHT-EMITTING DEVICE AND IMAGE DISPLAY APPARATUS

(71) Applicants: SONY GROUP CORPORATION, Tokyo (JP); SONY SEMICONDUCTOR SOLUTIONS CORPORATION, Kanagawa (JP)

(72) Inventors: Toshihiko Watanabe, Tokyo (JP); Hiroyuki Kashihara, Kanagawa (JP); Toshihiro Miura, Kanagawa (JP); Toshiaki Hasegawa, Kanagawa (JP); Toru Sasaki, Kanagawa (JP); Tetsuo Minami, Kanagawa (JP); Kei Kimura, Kanagawa (JP); Toshio Fujino, Kangawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 362 days.

(21) Appl. No.: 18/559,430

(22) PCT Filed: Feb. 18, 2022

(86) PCT No.: PCT/JP2022/006606
§ 371 (c)(1),
(2) Date: Nov. 7, 2023

(87) PCT Pub. No.: WO2022/239354
PCT Pub. Date: Nov. 17, 2022

(65) Prior Publication Data
US 2024/0243109 A1 Jul. 18, 2024

(30) Foreign Application Priority Data
May 14, 2021 (JP) ................................ 2021-082674

(51) Int. Cl.
*H10W 90/00* (2026.01)
*H10H 20/851* (2025.01)
(Continued)

(52) U.S. Cl.
CPC ........ *H10W 90/00* (2026.01); *H10H 20/8512* (2025.01); *H10H 20/856* (2025.01); *H10H 20/8581* (2025.01)

(58) Field of Classification Search
CPC .............. H10W 90/00; H10H 20/8581; H10H 20/8512; H10H 20/856
See application file for complete search history.

(56) References Cited

U.S. PATENT DOCUMENTS

| | | | | |
|---|---|---|---|---|
| 2018/0166424 | A1* | 6/2018 | Sim ...................... | H10W 90/00 |
| 2020/0343417 | A1 | 10/2020 | Miyamoto | |

(Continued)

FOREIGN PATENT DOCUMENTS

| | | |
|---|---|---|
| JP | 2010-087224 | 4/2010 |
| JP | 2016-045979 | 4/2016 |

(Continued)

OTHER PUBLICATIONS

International Search Report and Written Opinion prepared by the Japan Patent Office on Mar. 9, 2022, for International Application No. PCT/JP2022/006606, 3 pgs.

*Primary Examiner* — Anne M Hines
(74) *Attorney, Agent, or Firm* — SHERIDAN ROSS P.C.

(57) ABSTRACT

A light-emitting device according to an embodiment of the present disclosure includes: a substrate having a first surface and a second surface that are opposed to each other; a plurality of light-emitting elements arranged in an array on the first surface side of the substrate; a partition wall formed above the plurality of light-emitting elements using a metal material and having an opening for each of the plurality of (Continued)

light-emitting elements; and a wavelength conversion layer that is provided in the opening and converts a wavelength of light outputted from the plurality of light-emitting elements.

20 Claims, 21 Drawing Sheets

(51) Int. Cl.

| | |
|---|---|
| ***H10H 20/856*** | (2025.01) |
| ***H10H 20/858*** | (2025.01) |

(56) References Cited

U.S. PATENT DOCUMENTS

| | | | | |
|---|---|---|---|---|
| 2021/0020619 | A1 | 1/2021 | Iguchi et al. | |
| 2021/0135064 | A1 | 5/2021 | Ishio | |
| 2021/0151542 | A1* | 5/2021 | Choe .................... | G09G 3/3266 |
| 2021/0265420 | A1* | 8/2021 | Itou ...................... | H10H 29/142 |

FOREIGN PATENT DOCUMENTS

| | | |
|---|---|---|
| JP | 2020-086461 | 6/2020 |
| JP | 2020-181936 | 11/2020 |
| JP | 2021-019015 | 2/2021 |
| JP | 2021-071645 | 5/2021 |
| WO | WO 2020/195786 | 10/2020 |

* cited by examiner

LIGHT-EMITTING DEVICE AND IMAGE DISPLAY APPARATUS

CROSS REFERENCE TO RELATED APPLICATIONS

This application is a national stage application under 35 U.S.C. 371 and claims the benefit of PCT Application No. PCT/JP2022/006606, having an international filing date of 18 Feb. 2022, which designated the United States, which PCT application claimed the benefit of Japanese Patent Application No. 2021-082674, filed 14 May 2021, the entire disclosures of each of which are incorporated herein by reference.

TECHNICAL FIELD

The present disclosure relates to a light-emitting device and an image display apparatus including the same.

BACKGROUND ART

For example, Patent Literature 1 discloses a display device having a reflection film on a side surface of a partition wall provided between a blue conversion layer, a green conversion layer, and a red conversion layer provided on a light-emitting layer. In addition, for example, Patent Literature 2 discloses a display device in which an organic layer and a second electrode layer extend on a side surface and an upper surface of a partition wall provided between a plurality of light-emitting elements having an organic layer including a light-emitting layer.

CITATION LIST

Patent Literature

Patent Literature 1: Japanese Unexamined Patent Application Publication No. 2020-086461

Patent Literature 2: Japanese Unexamined Patent Application Publication No. 2016-45979

SUMMARY OF THE INVENTION

Incidentally, an image display apparatus using a light-emitting diode (LED) as a light source of a display pixel is demanded to improve display quality.

It is desirable to provide a light-emitting device and an image display apparatus that make it possible to improve display quality.

A light-emitting device according to an embodiment of the present disclosure includes a substrate having a first surface and a second surface facing each other, a plurality of light-emitting elements arranged in an array on a first surface side of the substrate, a partition wall formed above the plurality of light-emitting elements using a metal material and having an opening for each of the plurality of light-emitting elements, and a wavelength conversion layer provided in the opening and converting a wavelength of light outputted from the plurality of light-emitting elements.

An image display apparatus according to an embodiment of the present disclosure includes a light-emitting device, and includes the light-emitting device according to the embodiment of the present disclosure described above as a light-emitting device.

In the light-emitting device according to the embodiment of the present disclosure and the image display apparatus according to the embodiment of the present disclosure, the partition wall that is disposed above the plurality of light-emitting elements arranged in an array and separates, for each of the light-emitting elements, the wavelength conversion layer that converts the wavelength of the light outputted from the plurality of light-emitting elements is formed using the metal material. This suppresses a temperature increase of the wavelength conversion layer.

MODES FOR CARRYING OUT THE INVENTION

Figure 1:
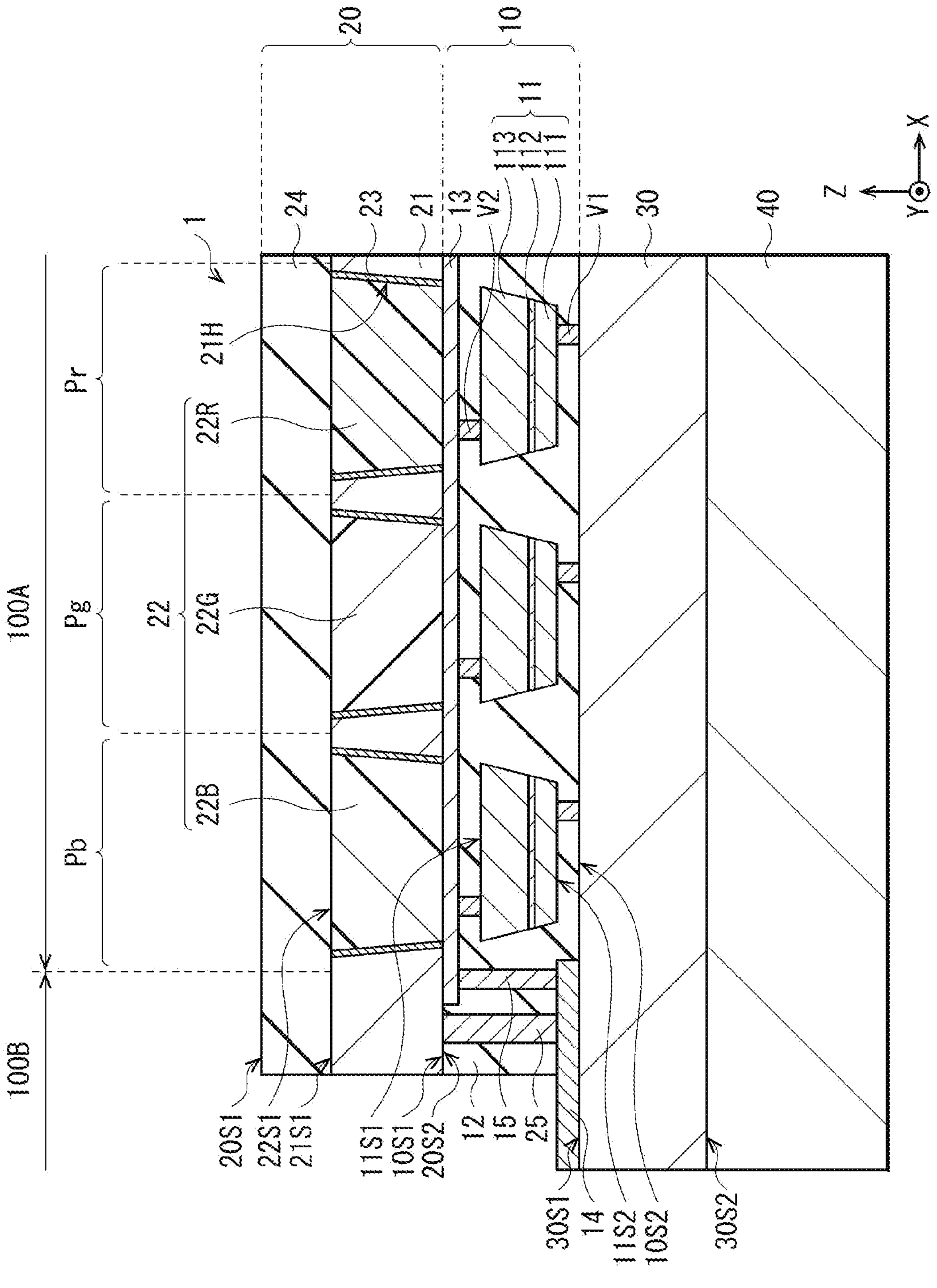
FIG. 1 is a schematic cross-sectional diagram illustrating an example of a configuration of a light-emitting device according to an embodiment of the present disclosure.

Hereinafter, an embodiment of the present disclosure will be described in detail with reference to the drawings. The following description is a specific example of the present disclosure, but the present disclosure is not limited to the following embodiment. In addition, the present disclosure is not limited to arrangement, dimensions, dimensional ratios, and the like of the constituent elements illustrated in the drawings. It is to be noted that the description is given in the following order.

1. Embodiment (an example in which a partition wall configuring a wavelength conversion section disposed above a light-emitting section is formed using a metal material)
1-1. Configuration of Light-Emitting Device
1-2. Method of Manufacturing Light-Emitting Device
1-3. Workings and Effects
2. Modification Examples
2-1. First Modification Example (another example of the light-emitting device)
2-2. Second Modification Example (another example of the light-emitting device)
2-3. Third Modification Example (another example of the light-emitting device)
2-4. Fourth Modification Example (another example of the light-emitting device)
2-5. Fifth Modification Example (another example of the light-emitting device)
2-6. Sixth Modification Example (another example of the light-emitting device)
2-7. Seventh Modification Example (another example of the light-emitting device)
2-8. Eighth Modification Example (another example of the light-emitting device)
3. Application Examples

1. Embodiment

Figure 2:
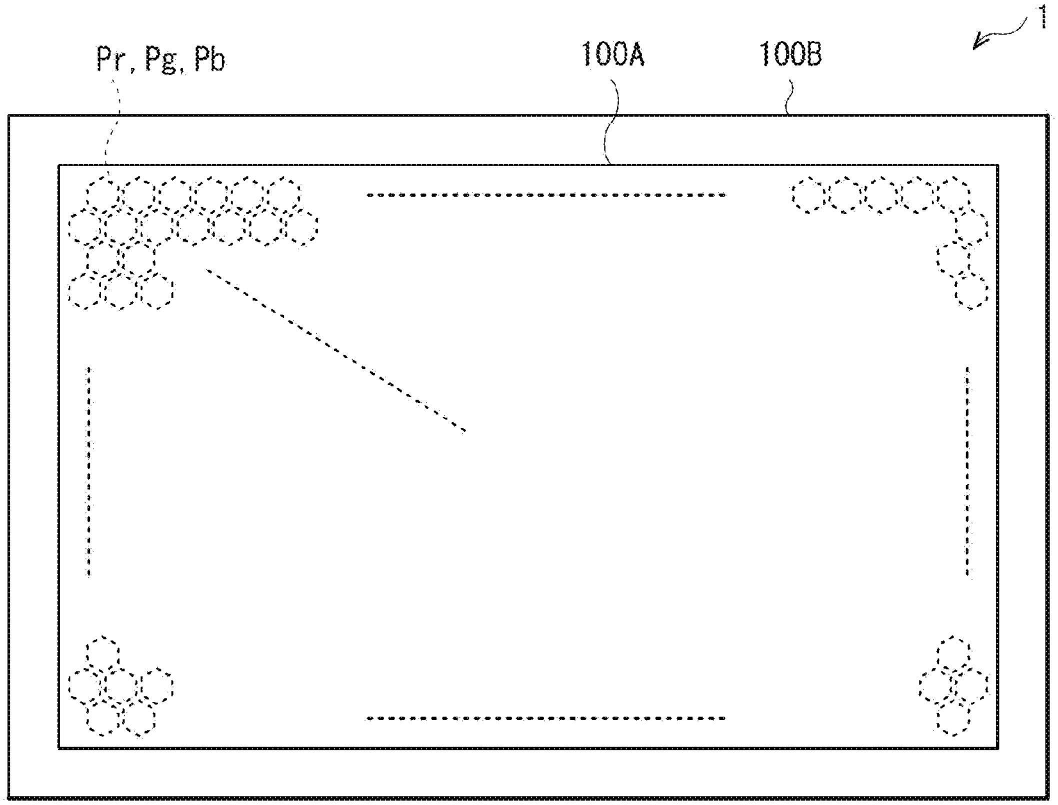
FIG. 2 is a schematic diagram illustrating an example of a planar configuration of the light-emitting device as a whole illustrated in FIG. 1.

FIG. 1 schematically illustrates an example of a cross-sectional configuration of a light-emitting device (a light-emitting device 1) according to an embodiment of the present disclosure. FIG. 2 schematically illustrates an example of a planar configuration of the light-emitting device 1 as a whole illustrated in FIG. 1. The light-emitting device 1 is suitably applicable to a display section of an image display apparatus (an image display apparatus 100, see FIG. 18) which is a so-called LED display.

1-1. Configuration of Light-Emitting Device

The light-emitting device 1 includes, for example, a light-emitting section 10 in which a plurality of light-emitting elements 11 is arranged in an array, a partition wall 21 having an opening 21H for each of the light-emitting elements 11, and a wavelength conversion section 20 having a wavelength conversion layer 22 provided in the opening 21H, which are laminated in this order on a surface 30S1 side of a circuit substrate 30 having a surface (a surface 30S1) and a back surface (a surface 30S2) that are opposed to each other. In the present embodiment, the partition wall 21 and the wavelength conversion layer 22 are integrally formed, and the partition wall 21 is formed using a metal material. Furthermore, the light-emitting device 1 is coupled to the circuit substrate 30, for example, via a through wiring line 25 in an outer peripheral section 100B around an array section 100A in which a plurality of light-emitting elements 11 is arranged in a two-dimensional array.

The light-emitting section 10 includes the plurality of light-emitting elements 11 arranged in a two-dimensional array as described above, an insulating layer 12 in which the plurality of light-emitting elements 11 is embedded, and an electrode layer 13 as a common electrode for the plurality of light-emitting elements 11. The light-emitting section 10 further includes a wiring line 14 formed on, for example, the surface 30S1 of the circuit substrate 30, and the through wiring line 15 electrically coupling the electrode layer 13 and the wiring line 14.

The light-emitting element 11 corresponds to a specific example of a "light-emitting element" of the present disclosure. The light-emitting element 11 is a solid-state light-emitting element that emits light of a predetermined wavelength band from a light extraction surface (a surface 11S1), and is, for example, an LED (Light-Emitting Diode) chip. The term "LED chip" refers to that which is cut out from a wafer used for a crystal growth, and is not of a package-type covered with a molded plastic or the like. The LED chip is, for example, 5 μm or more and 100 μm or less, and is a so-called micro LED.

In the light-emitting element 11, a first conductivity type layer 111, an active layer 112, and a second conductivity type layer 113 are laminated in this order, and an upper surface of the second conductivity type layer 113 serves as a light-extraction surface (the surface 11S1). The light-emitting element 11 further includes electrodes electrically coupled to the first conductivity type layer 111 and the second conductivity type layer 113, respectively, although not illustrated. Vias V1 and V2 are coupled to the respective electrodes, and the via V1 electrically couples the first conductivity type layer 111 and the circuit substrate 30, and the via V2 electrically couples the second conductivity type layer 113 and the electrode layer 13.

The first conductivity type layer 111 includes, for example, an n-type GaN-based semiconductor material. The active layer 112 has, for example, a multi-quantum-well structure in which InGaN and GaN are alternately laminated, and has a light-emitting region in the layer. From the active layer 112, for example, light in a blue band of 430 nm or more and 500 nm or less are extracted. In addition to this, light having a wavelength corresponding to, for example, an ultraviolet region (ultraviolet light) may be extracted from the active layer 112. The second conductivity type layer 113 includes, for example, a p-type GaN-based semiconductor material.

The electrode electrically coupled to the first conductivity type layer 111 is in ohmic contact with the first conductivity type layer 111, and is formed using, for example, a multilayer film (Ni/Au) of nickel (Ni) and gold (Au), or a transparent conductive material such as indium-tin-oxide (ITO). The electrode electrically coupled to the second conductivity type layer 113 is in ohmic contact with the second conductivity type layer 113, and is formed using, for example, a multilayer film (Ti/Al) of titanium (Ti) and aluminum (Al), a multilayer film (Cr/Au) of chromium (Cr) and gold (Au), or a transparent conductive material such as ITO.

Although not illustrated, a laminated film that includes an insulating film and a reflection film is provided on a side surface of the light-emitting element 11. The laminated film extends to, for example, an electrode provided on the first conductivity type layer 111 side, and the electrode is exposed to the outside from the laminated film.

The insulating layer 12 buries the plurality of light-emitting elements 11 and forms a flat surface (a surface 10S1) and a back surface (a surface 10S2) of the light-emitting section 10. The insulating layer 12 is configured by, for example, silicon oxide (SiO), silicon nitride (SiN), or the like.

The electrode layer 13 is provided above the plurality of light-emitting elements 11 as a common electrode for the plurality of light-emitting elements 11. Specifically, the electrode layer 13 is embedded in the insulating layer 12, extends from the array section 100A to a portion of the outer peripheral section 100B, and forms the surface 10S1 together with the insulating layer 12. The electrode layer 13 includes a transparent electrode material such as ITO, indium-zinc-oxide (IZO), tin-oxide (SnO), or TiO.

The wiring line 14 is provided, for example, on the outer peripheral section 100B of the circuit substrate 30 so as to surround the array section 100A, and is coupled to, for example, an external terminal. As described above, the wiring line 14 is electrically coupled to the electrode layer 13 via the through wiring line 15 and the partition wall 21 via the through wiring line 25, respectively. The wiring line 14 is formed using, for example, copper (Cu), Al, Au, silver (Ag), Ti, or an alloy thereof. The wiring line 14 may be formed as a single-layer film or a laminated film using the above-described material. For example, by forming a Ti film or a TiN film on front and back surfaces of the wiring line 14, it is possible to improve reliability such as adherence. The through wiring lines 15 and 25 are formed using, for example, Cu, Al, tungsten (W), Ag, or an alloy thereof. Similarly to the wiring line 14, the through wiring lines 15 and 25 may form a Ti film or a TiN film on their front and back surfaces. This makes it possible to improve reliability such as adherence.

The wavelength conversion section 20 is provided on the surface 10S1 side of the light-emitting section 10. As described above, the wavelength conversion section 20 includes, for example, the partition wall 21 having the opening 21H for each of the light-emitting elements 11, and the wavelength conversion layer 22 provided in the opening 21H. A light reflection film 23 is further provided between the partition wall 21 and the wavelength conversion layer 22. A protective layer 24 is further provided on the light-extraction surface (a surface 20S1) side of the wavelength conversion section 20.

Figure 3:
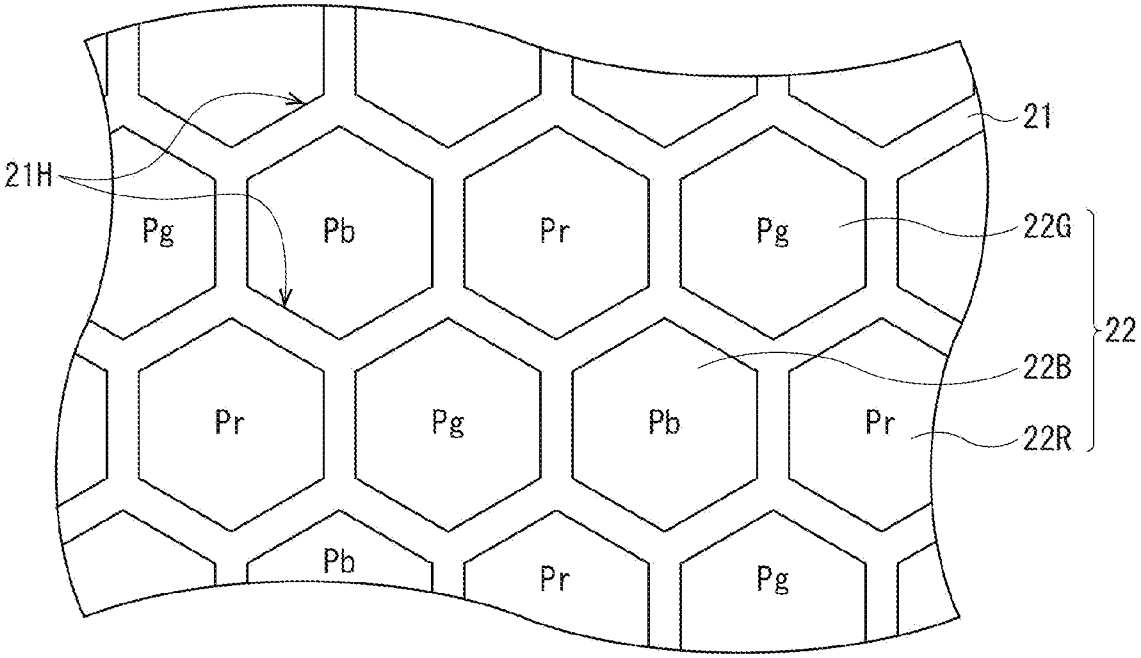
FIG. 3 is an enlarged schematic diagram illustrating a portion of the planar configuration of the light-emitting device illustrated in FIG. 2.

The partition wall 21 corresponds to a specific example of a "partition wall" of the present disclosure. When the light-emitting device 1 is applied to the image display apparatus 100, the partition wall 21 suppresses an occurrence of color mixing due to light leakage between subpixels (a red pixel Pr, a green pixel Pg, and a blue pixel Pb) of neighboring RGB. The partition wall 21 has, for example, a honeycomb structure. Specifically, as illustrated in FIG. 3, the partition wall 21 has, for example, a substantially regular hexagonal opening 21H for each of the plurality of light-emitting elements 11 arranged in an array. The opening 21H has, for example, an inclined surface of less than 90° with respect to the surface 20S2, of the wavelength conversion section 20, that is on an opposite side of the surface 20S1 in the cross-sectional view. That is, the partition wall 21 has a tapered shape between the adjacent color pixels Pr, Pg, and Pb in a cross-sectional view. The partition wall 21 is preferably formed using a material having a high thermal conductivity and a high electric conductivity, and is formed using, for example, a metal material such as Cu, Al, Au, nickel (Ni), or platinum (Pt).

The wavelength conversion layer 22 corresponds to a specific example of a "wavelength conversion layer" of the present disclosure. The wavelength conversion layer 22 is for converting light outputted from the plurality of light-emitting elements 11 into a desired wavelength (for example, red (R)/green (G)/blue (B)) and outputting the converted light, and is formed in the opening 21H provided above the light-emitting elements 11. Specifically, the red pixel Pr is provided with a red wavelength conversion layer 22R that converts light outputted from the light-emitting element 11 into red band light (red light), the green pixel Pg is provided with a green wavelength conversion layer 22G that converts light outputted from the light-emitting element 11 into green band light (green light), and the blue pixel Pb is provided with a blue wavelength conversion layer 22B that converts light outputted from the light-emitting element 11 into blue band light (blue light).

Each wavelength conversion layer 22R, 22G, and 22B is formable using quantum dots corresponding to each color. In particular, in a case where the red light is to be obtained, it is possible to select the quantum dots from, for example, InP, GaInP, InAsP, CdSe, CdZnSe, CdTeSe, or CdTe. In a case where the green light is to be obtained, it is possible to select the quantum dots from, for example, InP, GaInP, ZnSeTe, ZnTe, CdSe, CdZnSe, CdS, or CdSeS. In a case where the blue light is to be obtained, it is possible to select the quantum dots from, for example, ZnSe, ZnTe, ZnSeTe, CdSe, CdZnSe, CdS, CdZnS, or CdSeS. In a case where the blue light is to be outputted from the light-emitting element 11 as described above, the blue wavelength conversion layer 22B may be configured by a resin layer having light transparency.

The light reflection film 23 corresponds to a specific example of a "light reflection film" of the present disclosure. The light reflection film 23 is provided on a side surface of the opening 21H for efficiency extracting the respective pieces of color light outputted from the light-emitting elements 11 and converted in the respective wavelength conversion layers 22R, 22G, and 22B from a light extraction surface (a surface 22S1) of the wavelength conversion layer 22. The light reflection film 23 is formed using a metal material having light reflectivity. Examples of the metal material that forms the light reflection film 23 include a metal having a high reflectance in a visible light region. Specific examples of the material include Ag, Al, Cu, Au, Pt, Rh, and an alloy thereof.

Note that the light reflection film 23 does not necessarily have to be formed in a case where the partition wall 21 is formed using the metal material having the light reflectance described above.

The protective layer 24 is for protecting a surface of the light-emitting device 1, and includes, for example, SiO or SiN.

The circuit substrate 30 is provided with a driving circuit or the like that controls driving of the plurality of light-emitting elements 11 arranged in the array section 100A. A heat dissipation member 40 is provided on a surface (a surface 30S2) of the circuit substrate 30 that is on an opposite side of the surface 30S1 opposed to the light-emitting section 10 of the circuit substrate 30. The heat dissipation member 40 is, for example, a metal plate having a high-thermal conductivity such as Cu. The metal plate may be further provided with a plurality of heat dissipation fins.

1-2. Method of Manufacturing Light-Emitting Device

The light-emitting device 1 of the present embodiment is manufacturable, for example, as follows. FIGS. 4A to 4F illustrate exemplary manufacturing steps of the light-emitting device 1.

Figure 4A:
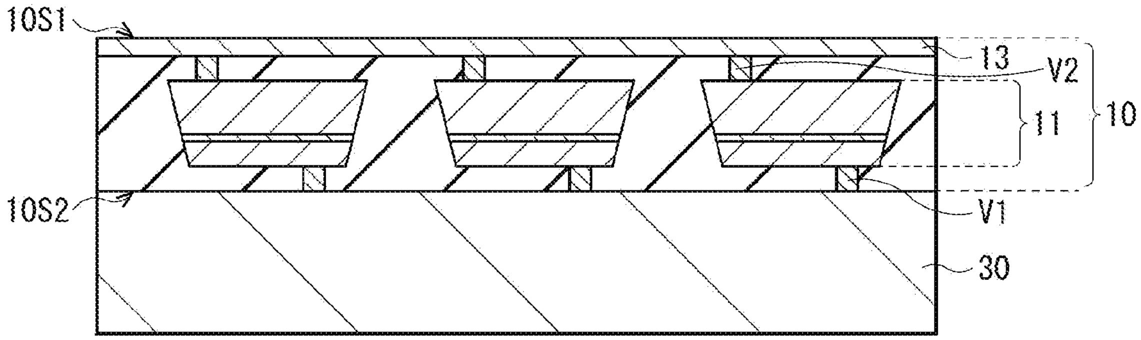
FIG. 4A is a schematic cross-sectional diagram illustrating a manufacturing process of the light-emitting device illustrated in FIG. 1.

First, as illustrated in FIG. 4A, the light-emitting section 10 having the plurality of light-emitting elements 11 on the surface 30S1 of the circuit substrate 30 and having the electrode layer 13 continuous above the plurality of light-emitting elements 11 is formed.

Figure 4B:
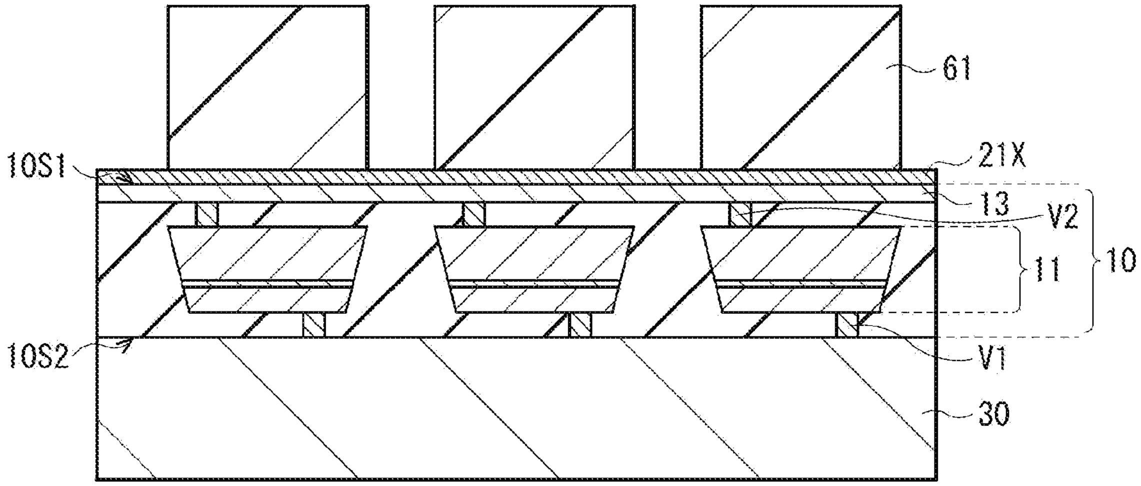
FIG. 4B is a schematic cross-sectional diagram illustrating a step following FIG. 4A.
Figure 4C:
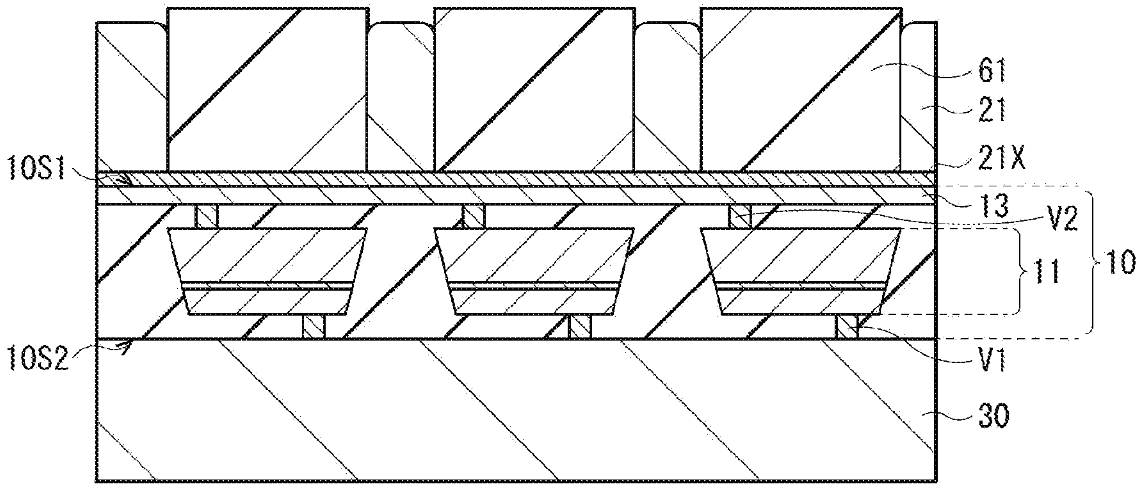
FIG. 4C is a schematic cross-sectional diagram illustrating a step following FIG. 4B.
Figure 4D:
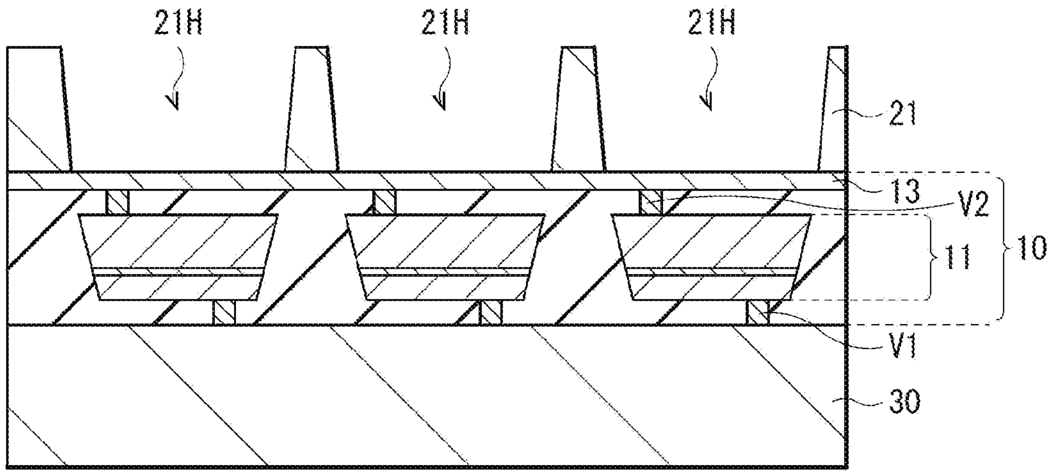
FIG. 4D is a schematic cross-sectional diagram illustrating a step following FIG. 4C.

Next, as illustrated in FIG. 4B, a seed layer 21X that includes, for example, Cu is formed on the surface 10S1 of the light-emitting section 10 by, for example, sputtering, and then a resist film 61 is patterned on the seed layer 21X by, for example, a photolithography technique. Subsequently, as illustrated in FIG. 4C, a Cu film to be the partition wall 21 is formed on the seed layer 21X exposed from the resist film 61 by, for example, electrolytic plating. Next, as illustrated in FIG. 4D, after the resist film 61 is removed, the opening 21H is shaped by etching, and the seed layer 21X exposed on the bottom surface of the opening 21H is removed. The shape of the opening 21H may be, for example, a forward tapered shape by forming the resist film 61 in an inverted tapered shape in a photolithography technique.

Figure 4E:
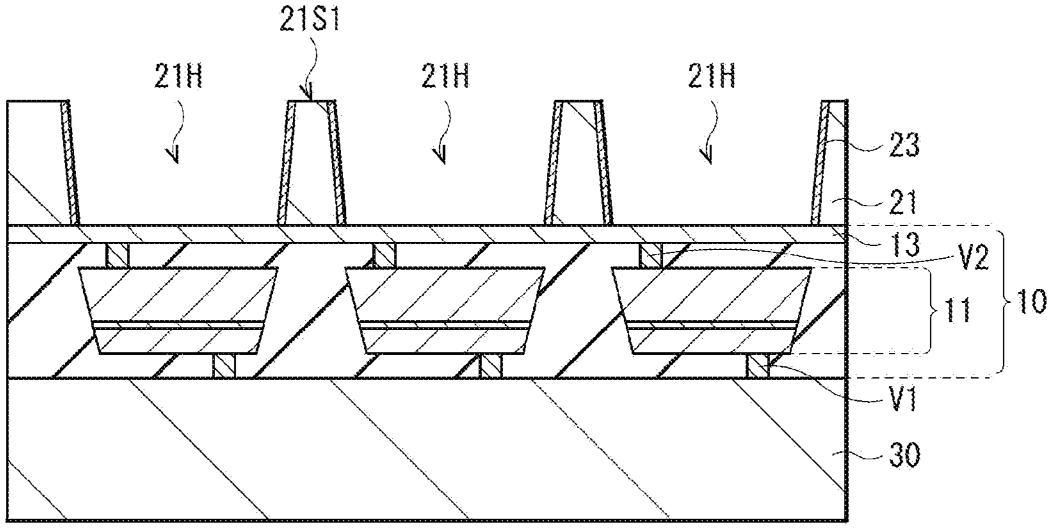
FIG. 4E is a schematic cross-sectional diagram illustrating a step following FIG. 4D.
Figure 4F:
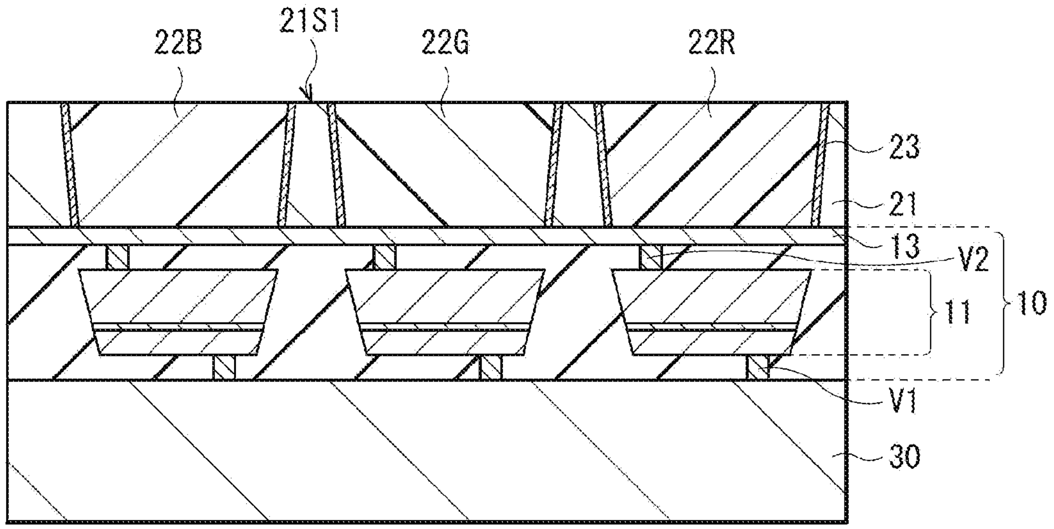
FIG. 4F is a schematic cross-sectional diagram illustrating a step following FIG. 4E.

Subsequently, as the light reflection film 23 by, for example, chemical vapor deposition (CVD), for example, a Ag film is formed on an upper surface of the partition wall 21 and the side surface and the bottom surface of the opening 21H, and then only Ag film formed on the upper surface of the partition wall 21 and the bottom surface of the opening 21H is removed by, for example, dry etching having anisotropy as illustrated in FIG. 4E. As a result, the light reflection film 23 is formed on the side surface of the partition wall 21. Next, as illustrated in FIG. 4F, the wavelength conversion layer 22 is formed in the opening 21H by a coating method such as an ink-jet method. Thereafter, the protective layer 24 is formed on the partition wall 21 and the wavelength conversion layer 22, and then the heat dissipation member 40 is bonded to the surface 30S2 of the circuit substrate 30. Thus, the light-emitting device 1 illustrated in FIG. 1 is completed.

Figure 5A:
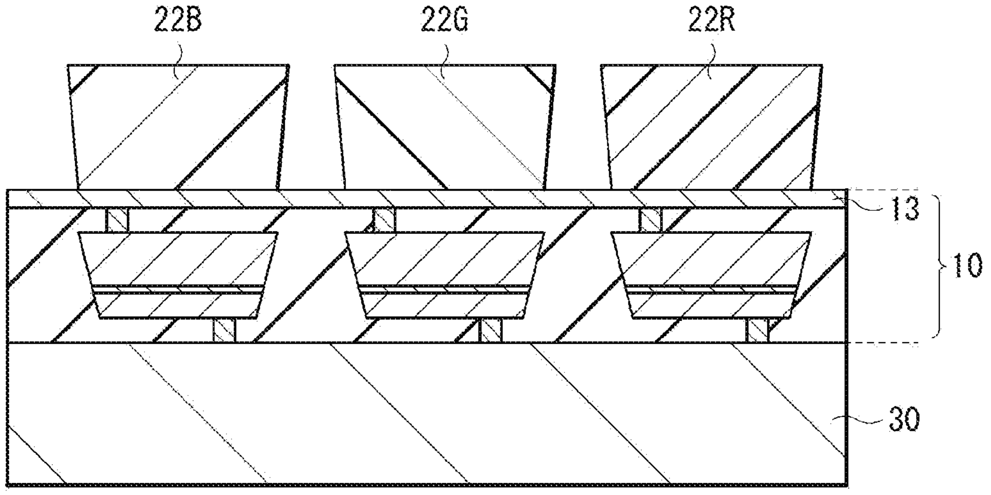
FIG. 5A is a cross-sectional schematic diagram illustrating another embodiment of the manufacturing process of the light-emitting device illustrated in FIG. 1.
Figure 5B:
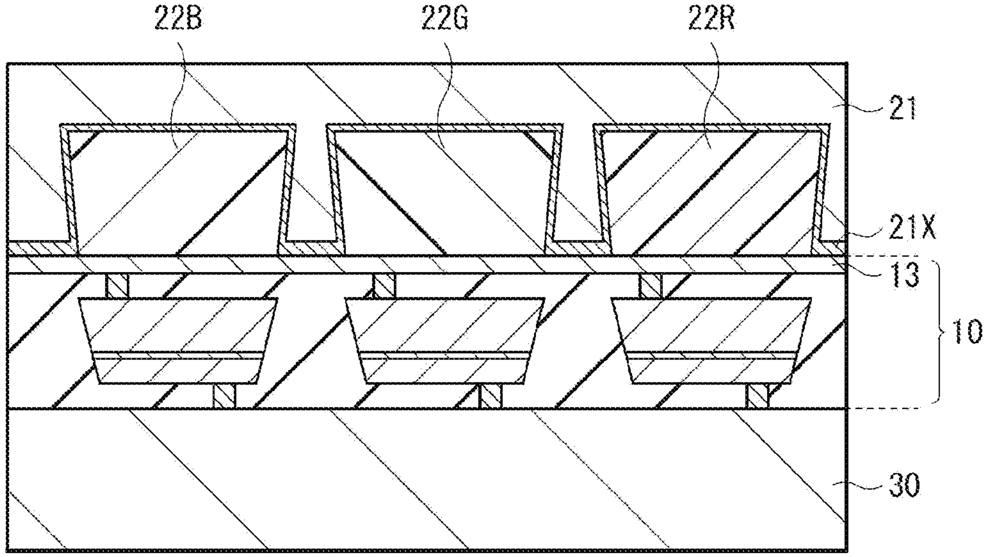
FIG. 5B is a schematic cross-sectional diagram illustrating a step following FIG. 5A.
Figure 5C:
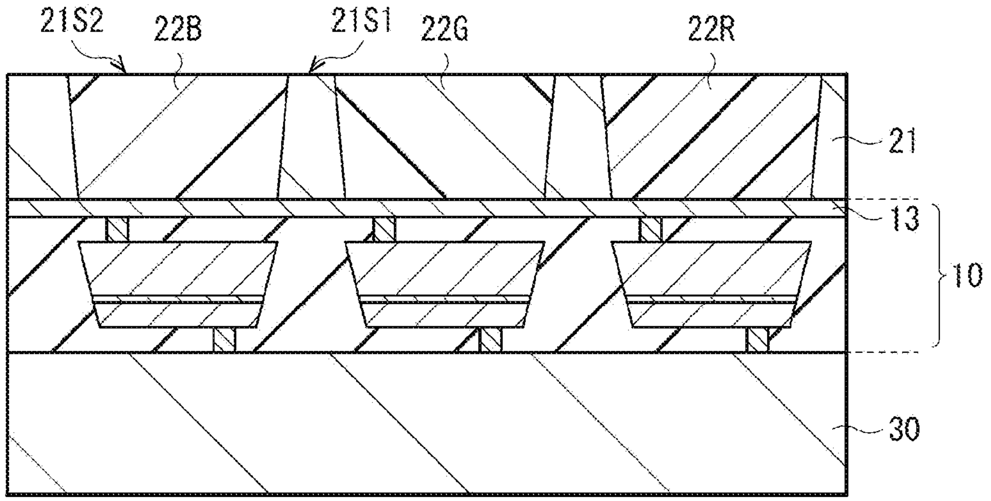
FIG. 5C is a schematic cross-sectional diagram illustrating a step following FIG. 5B.

The light-emitting device 1 of the present embodiment is manufacturable, for example, as follows. FIGS. 5A to 5C illustrate another exemplary manufacturing process of the light-emitting device 1.

First, in a manner similar to that described above, the light-emitting section 10 including the plurality of light-emitting elements 11 on the surface 30S1 of the circuit substrate 30 and the electrode layer 13 continuous above the plurality of light-emitting elements 11 is formed.

Next, as illustrated in FIG. 5A, the wavelength conversion layer 22 (22R, 22G, and 22B) are formed on the surface 10S1 of the light-emitting section 10 above the respective light-emitting elements 11 using, for example, a photolithography technique. Subsequently, as illustrated in FIG. 5B, for example, by sputtering, on an upper surface and a side surface of the electrode layer 13 and the wavelength conversion layer 22 (22R, 22G, and 22B), for example, a Cu film to be the partition wall 21 is formed on the seed layer 21X after forming the seed layer 21X that includes, for example, Cu.

Next, as illustrated in FIG. 5C, for example, by chemical mechanical polishing (CMP), the wavelength conversion layer 22 (22R, 22G, and 22B) is exposed by removing the Cu film formed on the wavelength conversion layer 22 (22R, 22G, and 22B). Thereafter, the protective layer 24 is formed on the partition wall 21 and the wavelength conversion layer 22, and then the heat dissipation member 40 is bonded to the surface 30S2 of the circuit substrate 30. Thus, the light-emitting device 1 illustrated in FIG. 1 is completed.

Figure 6A:
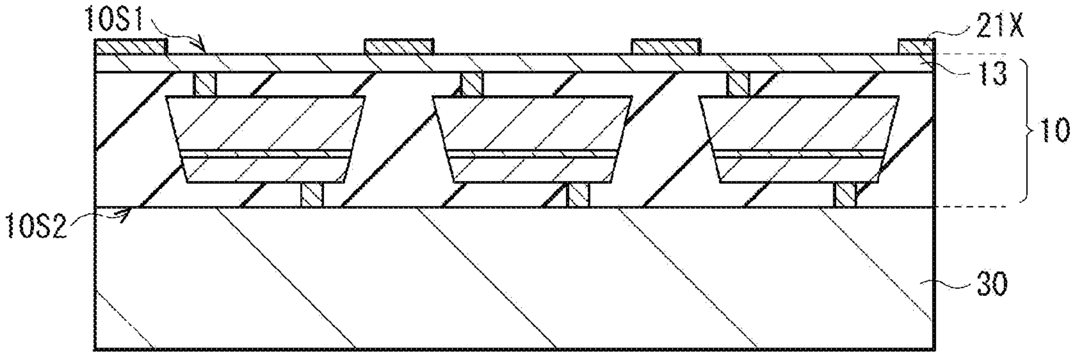
FIG. 6A is a cross-sectional schematic diagram illustrating another embodiment of the manufacturing process of the light-emitting device illustrated in FIG. 1.
Figure 6B:
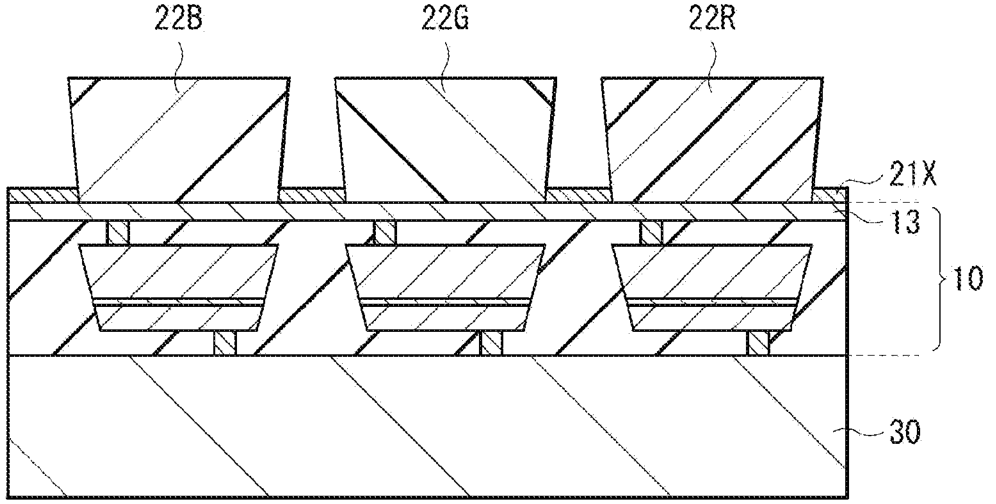
FIG. 6B is a schematic cross-sectional diagram illustrating a step following FIG. 6A.
Figure 6C:
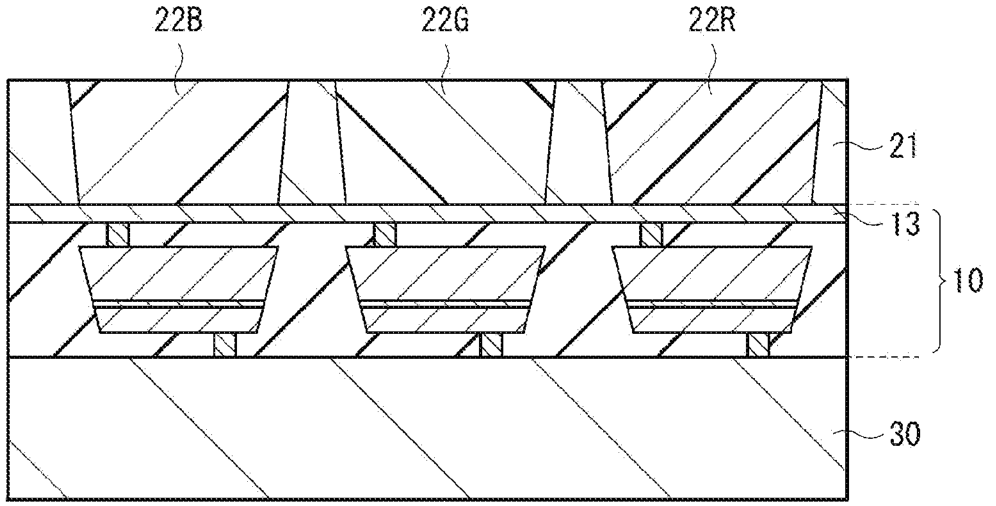
FIG. 6C is a schematic cross-sectional diagram illustrating a step following FIG. 6B.

The light-emitting device 1 of the present embodiment is manufacturable, for example, as follows. FIGS. 6A to 6C illustrate another exemplary manufacturing process of the light-emitting device 1.

First, in a manner similar to that described above, the light-emitting section 10 including the plurality of light-emitting elements 11 on the surface 30S1 of the circuit substrate 30 and the electrode layer 13 continuous above the plurality of light-emitting elements 11 is formed.

Next, as illustrated in FIG. 6A, the seed layer 21X that includes, for example, Cu is formed on the surface 10S1 of the light-emitting section 10, and then the seed layer 21X is patterned by, for example, photolithography and etching.

Subsequently, as illustrated in FIG. 6B, the wavelength conversion layer 22 (22R, 22G, and 22B) is formed on the electrode layer 13 from which the seed layer 21X has been removed, using, for example, a photolithography technique. Next, as illustrated in FIG. 6C, a Cu film to be the partition wall 21 is formed on the seed layer 21X by, for example, electrolytic plating. After the Cu film is formed, a surface may be polished by, for example, CMP in order to make a height of the partition wall 21 uniform. Thereafter, the protective layer 24 is formed on the partition wall 21 and the wavelength conversion layer 22, and then the heat dissipation member 40 is bonded to the surface 30S2 of the circuit substrate 30. Thus, the light-emitting device 1 illustrated in FIG. 1 is completed.

1-3. Workings and Effects

In the light-emitting device 1 of the present embodiment, the wavelength conversion section 20 having, for example, the partition wall 21 having the opening 21H for each of the light-emitting elements 11 and the wavelength conversion layer 22 provided in the opening 21H is provided on the surface 10S1 of the light-emitting section 10 including the plurality of light-emitting elements 11 arranged in an array. The partition wall 21 is formed using a metal material, and thereby a temperature increase of the wavelength conversion layer 22 is suppressed. This will be described below.

In recent years, a high-definition image display apparatus using a light-emitting device having a solid-state light-emitting device such as LED as a light source has become popular. In such a light-emitting device, for example, a plurality of LEDs is arranged in a two-dimensional array, and color-conversion layers are arranged above them.

In the light-emitting device having such a configuration, if an injection current value increases with an increase in luminance, a temperature of the color conversion layer increases and a power-luminance efficiency can decrease.

In contrast, in the present embodiment, the partition wall 21 separating the wavelength conversion layer 22 is formed using a metal material in the wavelength conversion section 20 disposed on the surface 10S1 of the light-emitting section 10 including the plurality of light-emitting elements 11 arranged in an array. As a result, a heat generated by the wavelength conversion layer 22 when the light-emitting device 1 is driven is dissipated from the upper surface (the surface 21S1) of the partition wall 21, making it possible to reduce the temperature increase of the wavelength conversion layer 22.

As described above, by applying the light-emitting device 1 of the present embodiment to an image display apparatus, it is possible to improve a display quality.

Further, in the light-emitting device 1 of the present embodiment, in the peripheral section 100B around the array section 100A in which the plurality of light-emitting elements 11 is arranged in an array, the partition wall 21 that includes a metal material is coupled to the wiring line 14 provided in the circuit substrate 30 via, for example, the through wiring line 25. As a result, the heat generated by the wavelength conversion layer 22 when the light-emitting device 1 is driven is dissipated from the circuit substrate 30 side in addition to the surface 21S1 of the partition wall 21. Therefore, it is possible to further reduce the temperature increase, and to further improve the display quality of the image display apparatus including the same.

Further, as described above, in a typical light-emitting device in which a plurality of LEDs is arranged in a two-dimensional array, an influence of the wiring line resistance becomes more remarkable, and there arises a problem that a light emission in a plane of an array section including the plurality of light-emitting elements becomes uneven.

In contrast, in the light-emitting device 1 of the present embodiment, the electrode layer 13 common to the plurality of light-emitting elements 11 is provided on the surface 10S1 of the light-emitting section 10, and the electrode layer 13 and the partition wall 21 are electrically coupled to each other. As a result, because a current flowing through the electrode layer 13 that includes a transparent electrode material generally having a high resistance flows through the partition wall 21 that is lower in resistance, a current loss generated when passing through the electrode layer 13 is reduced. In other words, the wiring line resistance in the plane of the array section 100A is reduced. Therefore, by applying the light-emitting device 1 of the present embodiment to the image display apparatus, uneven light emission in the display surface is reduced, making it possible to further improve the display quality.

Furthermore, in the light-emitting device 1 of the present embodiment, because the heat dissipation member 40 is disposed on the surface 30S2 side of the circuit substrate 30, the heat generated from the wavelength conversion layer 22 is dissipated from the heat dissipation member 40 via the partition wall 21, the through wiring line 25, and the circuit substrate 30. Therefore, it is possible to make the heat generation of the wavelength conversion layer 22 efficiently dissipated. Therefore, it is possible to further reduce the temperature increase, and to further improve the display quality of the image display apparatus including the same.

Further, in the light-emitting device 1 of the present embodiment, because the light reflection film 23 is formed on the side surface of the opening 21H of the partition wall 21, it is possible to allow the pieces of light (red light, green light, and blue light) having been subjected to the wavelength conversion in the wavelength conversion layer 22 (22R, 22G, and 22B) to be efficiently extracted from the upper surface (the surface 22S1) of the wavelength conversion layer 22.

Next, first to eighth modification examples and application examples of the present disclosure will be described. It is to be noted that components corresponding to those of the light-emitting device 1 according to the above-described embodiment are denoted with the same reference numerals, and descriptions thereof are omitted.

2. MODIFICATION EXAMPLES

2-1. First Modification Example

Figure 7:
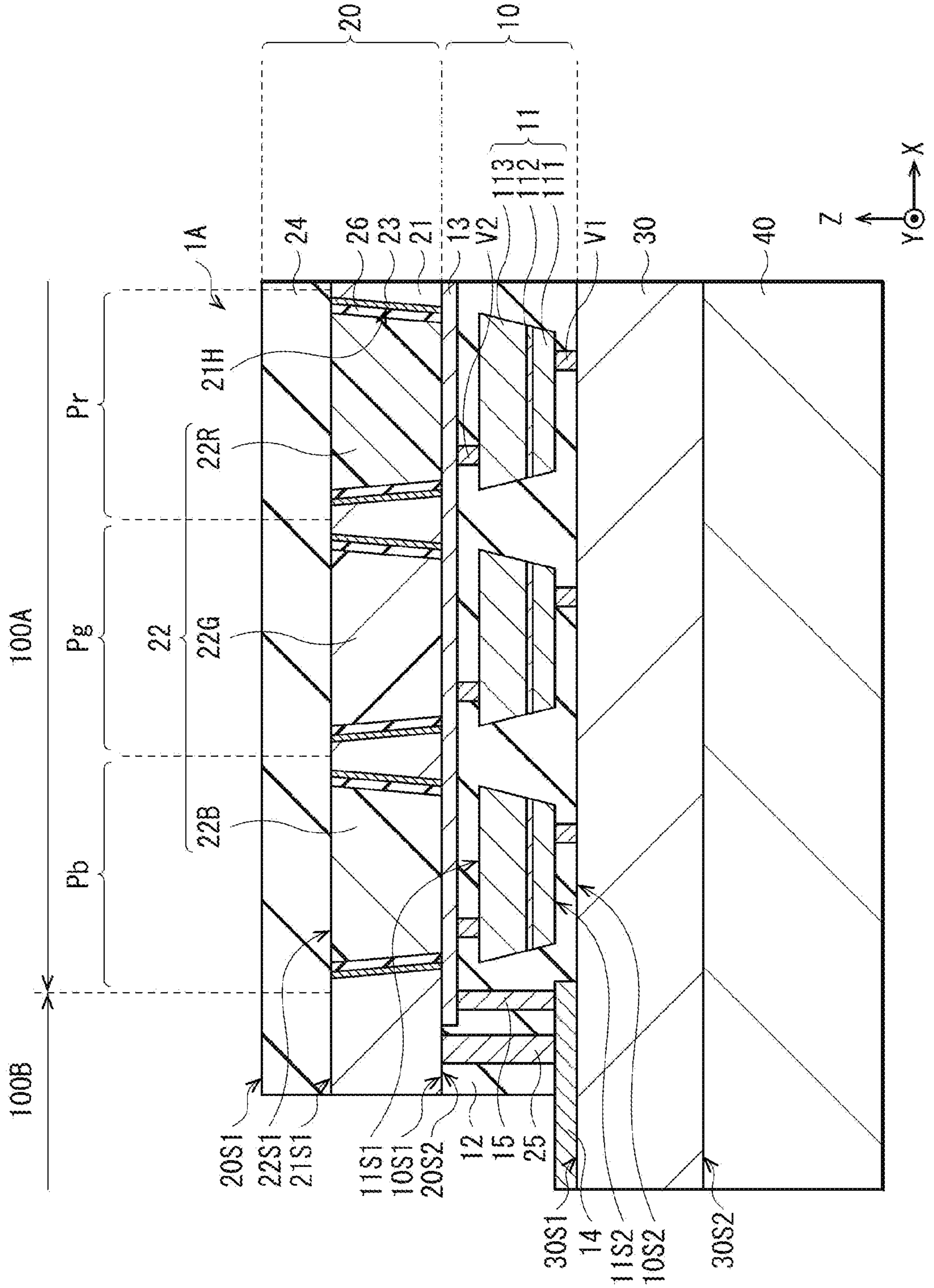
FIG. 7 is a schematic cross-sectional diagram illustrating an example of a configuration of a light-emitting device according to a first modification example of the present disclosure.

FIG. 7 schematically illustrates an example of a cross-sectional configuration of a light-emitting device (a light-emitting device 1A) according to a first modification example of the present disclosure. The light-emitting device 1A is suitably applicable to a display section of an image display apparatus (the image display apparatus 100) which is a so-called LED display as in the above-described embodiment. The light-emitting device 1A of the present modification example differs from the above-described embodiment in that a dielectric film 26 is further laminated on the light reflection film 23 formed on the side surface of the opening 21H of the partition wall 21.

The dielectric film 26 corresponds to a specific example of a "dielectric film" of the present disclosure. The dielectric film 26 is for reducing the elution of a metal from the partition wall 21 and the light reflection film 23 to the wavelength conversion layer 22 (22R, 22G, and 22B). The dielectric film 26 is configured by, for example, a single-layer film or a laminated film of an oxide, a nitride, or a fluoride such as silicon (Si), magnesium (Mg), Al, Hf, niobium (Nb), zirconium (Zr), scandium (Sc), tantalum (Ta), gallium (Ga), zinc (Zn), yttrium (Y), boron (B), or titanium (Ti).

As described above, in the present modification example, the dielectric film 26 is formed between the light reflection film 23 and the wavelength conversion layer 22 (22R, 22G, and 22B). This reduces a corrosive effect of the light reflection film 23 and a deterioration of the wavelength conversion layer 22 (22R, 22G, and 22B). Therefore, in addition to the effects of the above-described embodiments, it is possible to improve a lifetime of the light-emitting device 1A.

Further, it is possible to allow the dielectric film 26 to have a so-called dielectric multilayer film mirror structure by setting a thickness of the dielectric film 26 to an appropriate value and forming the dielectric film into a multilayer in consideration of a refractive index. Thus, in the light-emitting device 1A of the present modification example, it is possible to obtain a higher reflectance without absorbing the reflected light from the light reflection film 23.

2-2. Second Modification Example

Figure 8:
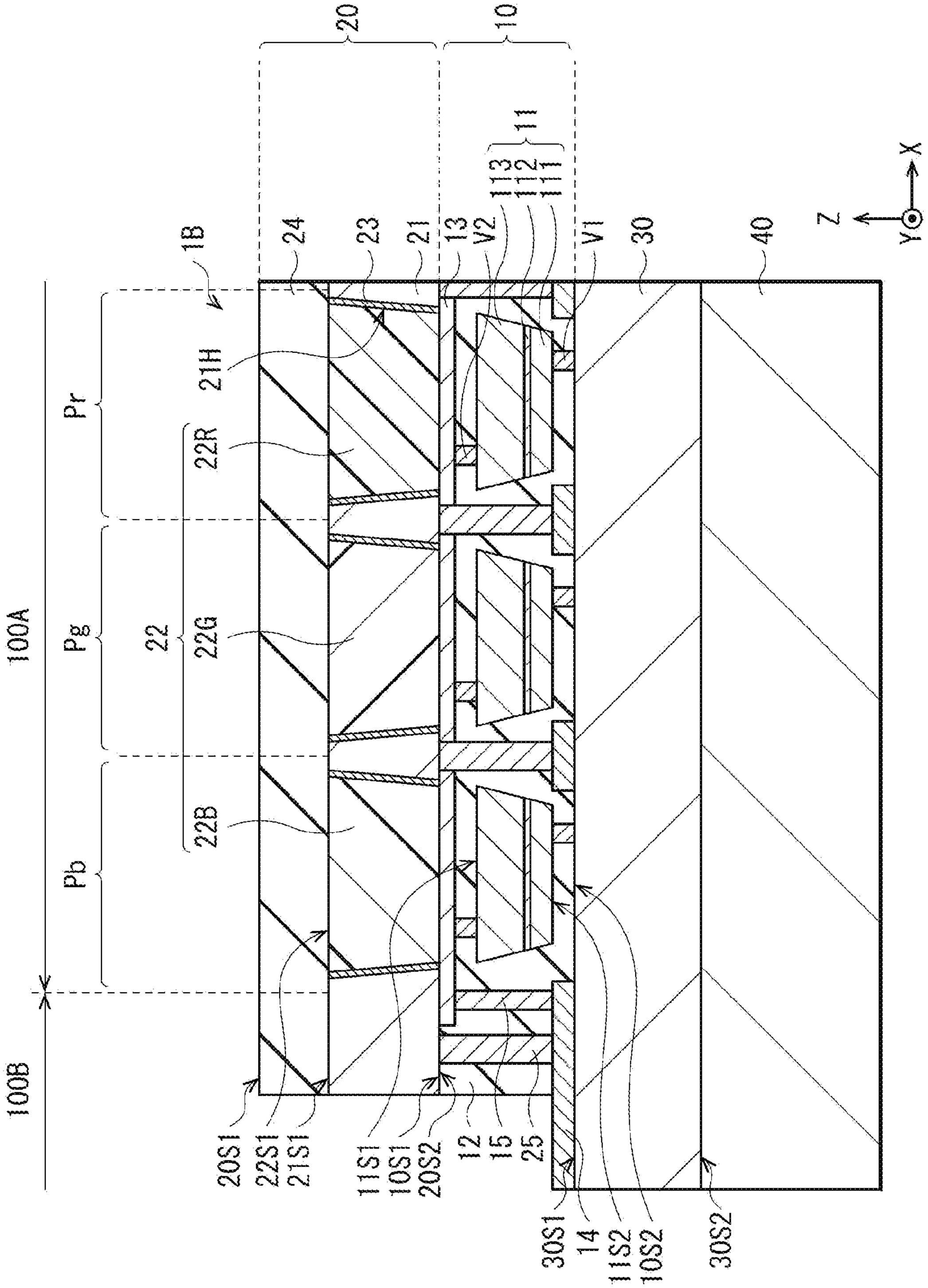
FIG. 8 is a schematic cross-sectional diagram illustrating an example of a configuration of a light-emitting device according to a second modification example of the present disclosure.

FIG. 8 schematically illustrates an example of a cross-sectional configuration of a light-emitting device (a light-emitting device 1B) according to a second modification example of the present disclosure. The light-emitting device 1B is suitably applicable to a display section of an image display apparatus (the image display apparatus 100) which is a so-called LED display as in the above-described embodiment. The light-emitting device 1B of the present modification example differs from the above-described embodiment in that the partition wall 21 and the wiring line 14 are coupled to each other, for example, via the through wiring line 15 for each of the light-emitting elements 11 in the array section 100A.

As described above, in the present modification example, the partition wall 21 that includes a metal material and the wiring line 14 provided on the circuit substrate 30 are coupled to each of the one or more light-emitting elements 11 via the through wiring line 25. Therefore, the current loss caused by the electrode layer 13 is further reduced as compared with the light-emitting device 1 of the above-described embodiment. Therefore, it is possible to further reduce an uneven light emission in a display surface of the image display apparatus including the light-emitting device 1B of the present modification example, and to further improve the display quality.

2-3. Third Modification Example

Figure 9:
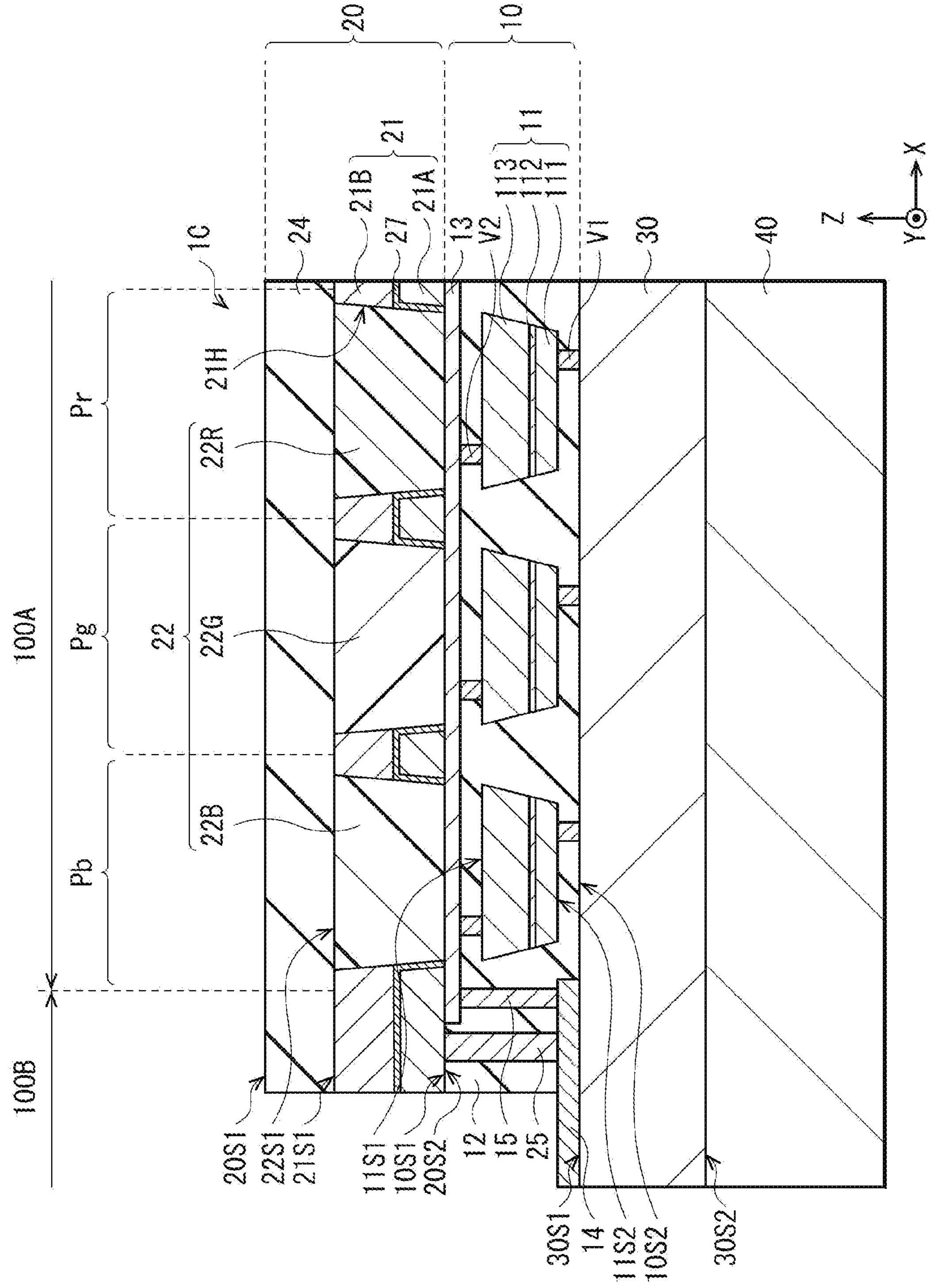
FIG. 9 is a schematic cross-sectional diagram illustrating an example of a configuration of a light-emitting device according to a third modification example of the present disclosure.

FIG. 9 schematically illustrates an example of a cross-sectional configuration of a light-emitting device (a light-emitting device 1C) according to a third modification example of the present disclosure. The light-emitting device 1C is suitably applicable to a display section of an image display apparatus (the image display apparatus 100) which is a so-called LED display as in the above-described embodiment. The light-emitting device 1C of the present modification example differs from the above-described embodiment in that the partition wall 21 has a laminated structure of a separation section 21A that includes a semiconductor material such as silicon and a separation section 21B that includes a metal material.

The partition wall 21 of the present modification example has a laminated-layer configuration in which the separation section 21A and the separation section 21B are laminated in this order from the light-emitting section 10. The separation section 21A corresponds to a specific example of a "first separation section" of the present disclosure, and is formed using, for example, silicon, and an insulating film 27 is formed on a surface thereof, for example. The insulating film 27 includes, for example, SiO or SiN. The separation section 21B corresponds to a specific example of a "second separation section" of the present disclosure, and is formed using a metal material as in the above-described embodiment.

For example, in the light-emitting device 1 of the above-described embodiment, as illustrated in FIG. 4B, for example, the partition wall 21 is formed to reflect the shape of the resist film 61, but it is difficult to form a uniform shape as a ratio (height/bottom area) of the bottom area and the height of the resist film 61, that is, the aspect ratio is larger.

In contrast, in the present modification example, because the partition wall 21 has the laminated structure of, for example, the separation section 21A that includes silicon and the separation section 21B that includes a metal material, the height of the resist film 61 becomes equivalent to the separation section 21B, making it possible to form a more uniform partition wall 21. An angle of the partition wall 21 influences a light extraction efficiency. Therefore, in the light-emitting device 1C of the present modification example, it is possible to further improve the display quality.

2-4. Fourth Modification Example

Figure 10:
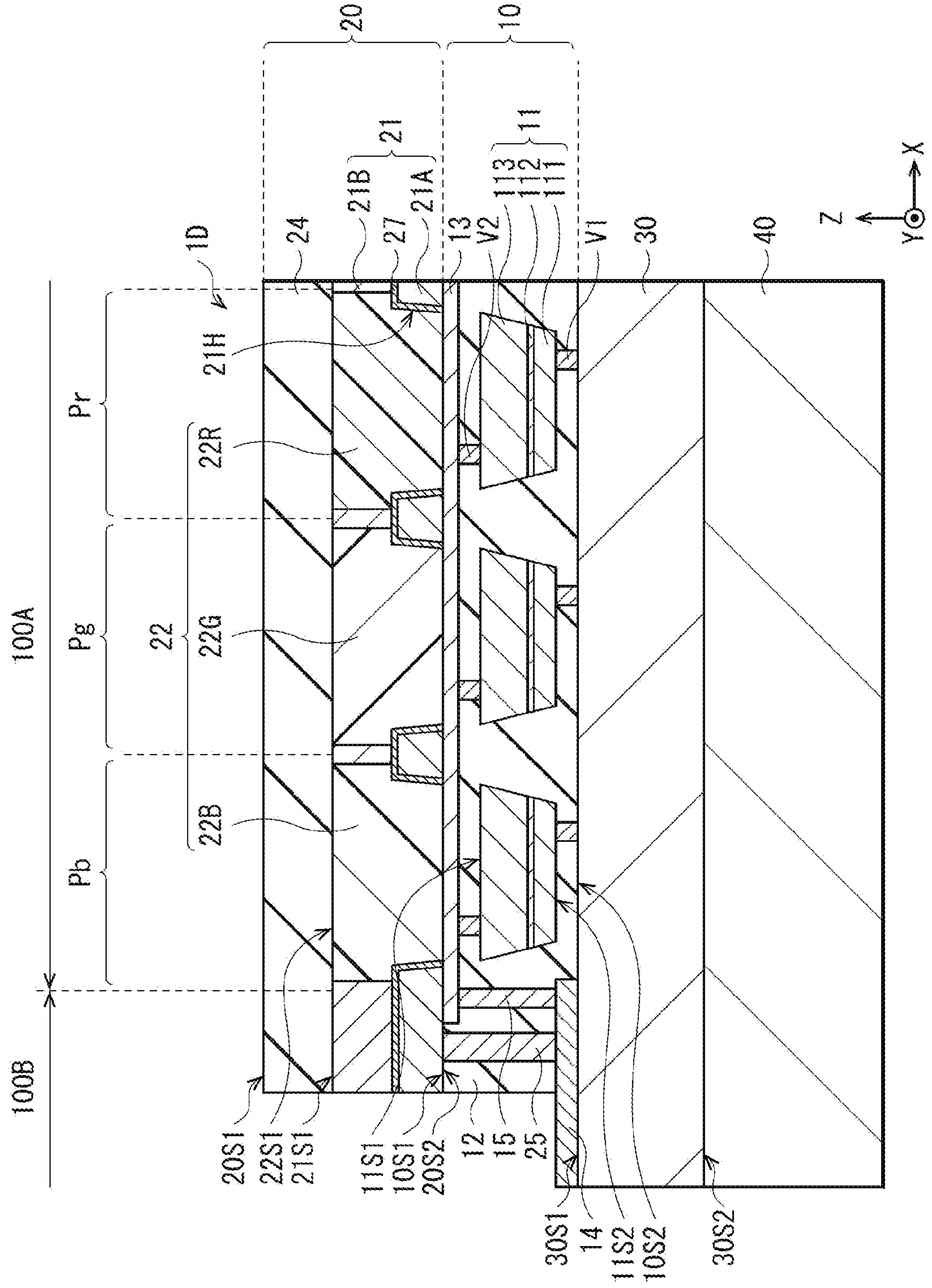
FIG. 10 is a schematic cross-sectional diagram illustrating an example of a configuration of a light-emitting device according to a fourth modification example of the present disclosure.

FIG. 10 schematically illustrates an example of a cross-sectional configuration of a light-emitting device (a light-emitting device 1D) according to a fourth modification example of the present disclosure. The light-emitting device 1D is suitably applicable to a display section of an image display apparatus (the image display apparatus 100) which is a so-called LED display as in the above-described embodiment. In the third modification example described above, although the separation section 21A and the separation section 21B configuring the laminated structure form a forward tapered continuous inclined surface in a cross-sectional view as with the embodiment described above, it is not limited thereto.

For example, an inclination angle of a side surface of the separation section 21B configuring the opening 21H with respect to the surface 10S1 may be larger than an inclination angle of a side surface of the separation section 21A configuring the opening 21H. Specifically, as illustrated in FIG. 10, the side surface of the separation section 21A may be a forward tapered inclined surface, and the side surface of the separation section 21B may be, for example, a surface substantially perpendicular to the surface 10S1 of the light-emitting section 10. This makes it possible to increase the volume of the wavelength conversion layer 22. Therefore, it is possible to achieve higher luminance.

2-5. Fifth Modification Example

Figure 11:
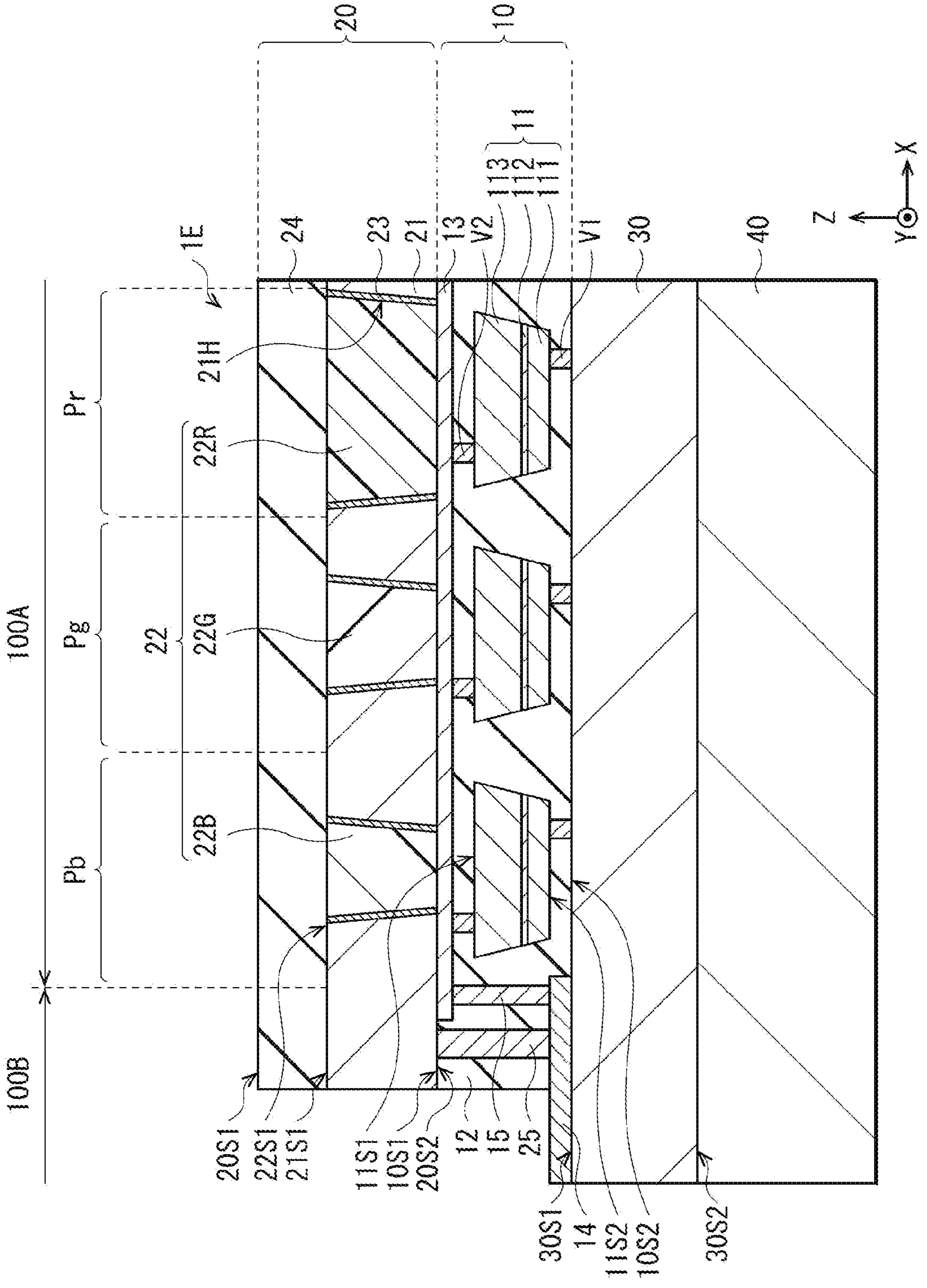
FIG. 11 is a schematic cross-sectional diagram illustrating an example of a configuration of a light-emitting device according to a fifth modification example of the present disclosure.
Figure 12:
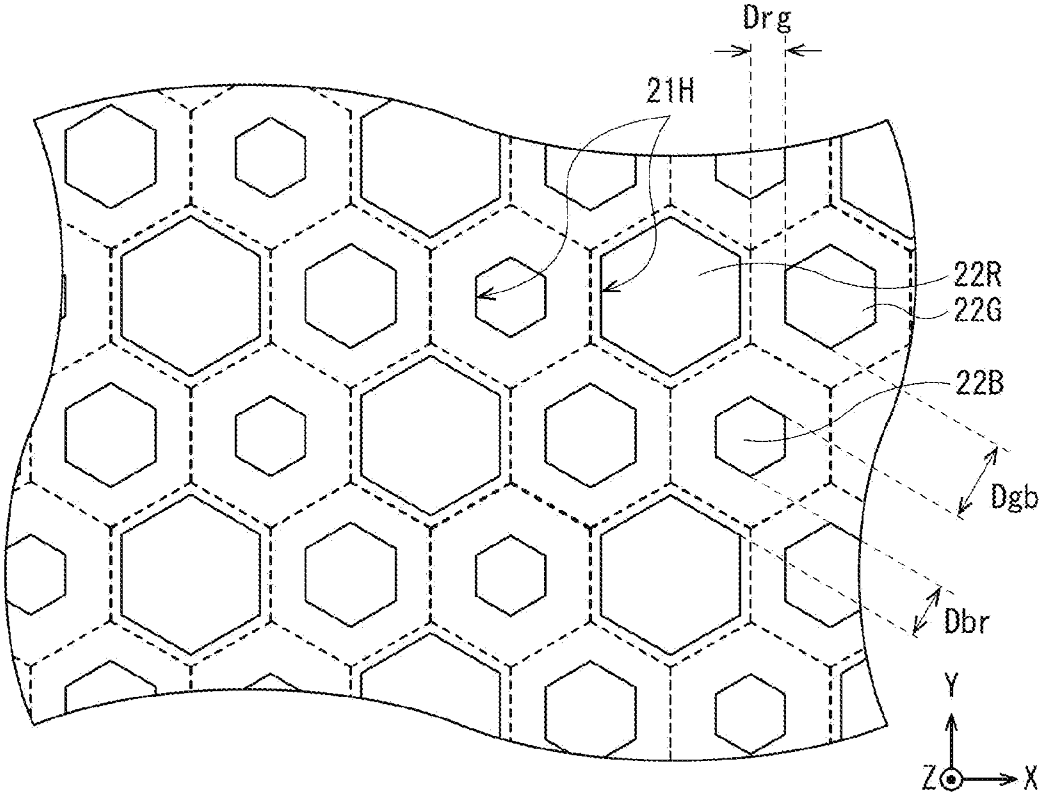
FIG. 12 is a schematic diagram illustrating an example of a planar configuration of the light-emitting device illustrated in FIG. 11.

FIG. 11 schematically illustrates an example of a cross-sectional configuration of a light-emitting device (a light-emitting device 1E) according to a fifth modification example of the present disclosure. FIG. 12 schematically illustrates an exemplary planar configuration of the wavelength conversion section 20 of the light-emitting device 1E illustrated in FIG. 11. The light-emitting device 1E is suitably applicable to a display section of an image display apparatus (the image display apparatus 100) which is a so-called LED display as in the above-described embodiment. The light-emitting device 1E of the present modification example differs from the above-described embodiment in that the light-emitting device 1E has opening widths Wr, Wg, and Rb that differ for respective color pixels Pr, Pg, and Pb.

Quantum dots configuring the respective wavelength conversion layers 22R, 22G, and 22B have different wavelength conversion efficiencies depending on their types. For example, the quantum dots that correspond to green generally have a lower wavelength conversion efficiency than the quantum dots that correspond to red. In a case where blue light is to be outputted from the light-emitting element 11, the blue wavelength conversion layer 22B is formable by a resin layer having a light-transmitting property as described above, so that there is no loss due to a wavelength conversion. Therefore, the opening widths Wr, Wg, and Rb in which the respective wavelength conversion layers 22R, 22G, and 22B are formed may be, for example, Wr>Wg>Rb depending on their wavelength conversion efficiencies. Accordingly, a width of the partition wall between the adjacent wavelength conversion layers 22R, 22G, and 22B ((Drg) between the red wavelength conversion layer 22R and the green wavelength conversion layer 22G, (Dgb) between the green wavelength conversion layer 22G and the blue wavelength conversion layer 22B, and (Dbr) between the blue wavelength conversion layer 22B and the red wavelength conversion layer 22R) is Drg<Dbr<Dgb, for example.

As described above, the opening widths Wr, Wg, and Rb that are different for the respective color pixels Pr, Pg, and Pb may be changed depending on, for example, the wavelength conversion efficiencies of the respective wavelength conversion layers 22R, 22G, and 22B. In this way, a color shift due to the wavelength conversion efficiencies of the respective wavelength conversion layers 22R, 22G, and 22B is reduced. Therefore, it is possible to further improve the display quality.

2-6. Sixth Modification Example

Figure 13:
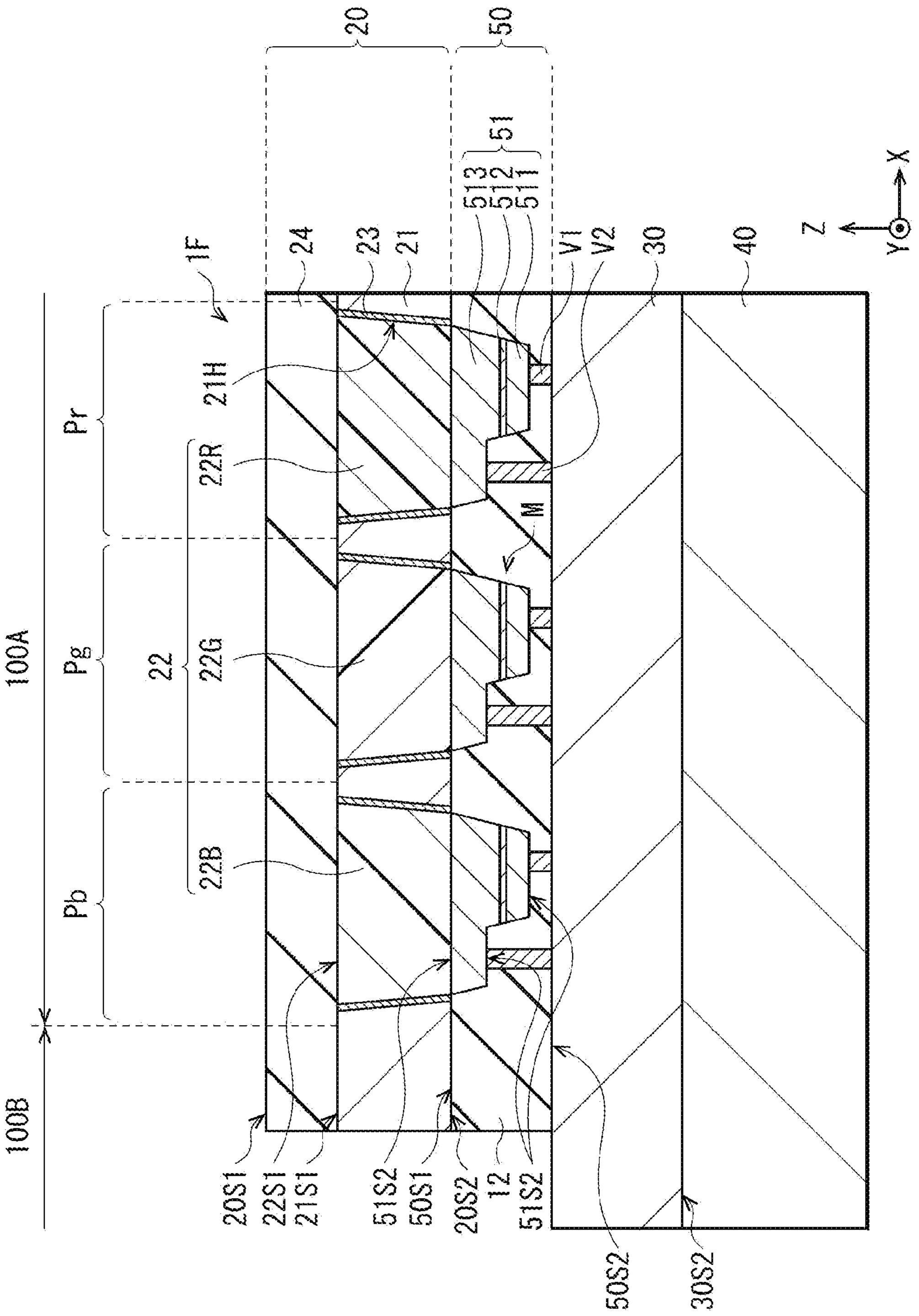
FIG. 13 is a schematic cross-sectional diagram illustrating an example of a configuration of a light-emitting device according to a sixth modification example of the present disclosure.

FIG. 13 schematically illustrates an example of a cross-sectional configuration of a light-emitting device (a light-emitting device 1F) according to a sixth modification example of the present disclosure. The light-emitting device 1F is suitably applicable to a display section of an image display apparatus (the image display apparatus 100) which is a so-called LED display as in the above-described embodiment. In the light-emitting device 1F of the present modification example, a plurality of light-emitting elements 51 having shapes that are different from those of the plurality of light-emitting elements 11 of the above-described embodiment are used.

In the light-emitting element 51, a first conductivity type layer 511, an active layer 512, and a second conductivity type layer 513 are laminated in this order, and the second conductivity type layer 513 serves as a light-extraction surface S1 (a surface 50S1). The light-emitting element 51 is provided with a columnar mesa section M including the first conductivity type layer 511 and the active layer 512, and has a step including a convex portion where the first conductivity type layer 511 is exposed and a concave portion where the second conductivity type layer 513 is exposed on a side of a surface (a surface 50S2) on an opposite side of the surface 50S1. Although not illustrated, the light-emitting element 51 further includes electrodes electrically coupled to the first conductivity type layer 511 and the second conductivity type layer 513, respectively. These electrodes are provided on the surface 50S2 side, and are electrically coupled to the circuit substrate 30 through the vias V1 and V2, respectively.

On side surfaces of the first conductivity type layer 511, the active layer 512, and the second conductivity type layer 513 of the light-emitting element 51, although not illustrated, a laminated film including an insulating film and a reflection film is provided. The laminated film extends, for example, to the electrodes provided in the first conductivity type layer 511 and the second conductivity type layer 513, respectively, and the electrodes are each exposed to the outside from the laminated film.

As described above, in the light-emitting device 1F according to the present modification example, the light-emitting element 51 that takes out the electrodes from one side is used unlike the above-described embodiment. In this case, effects similar to those of the above-described embodiment are obtainable.

2-7. Seventh Modification Example

Figure 14:
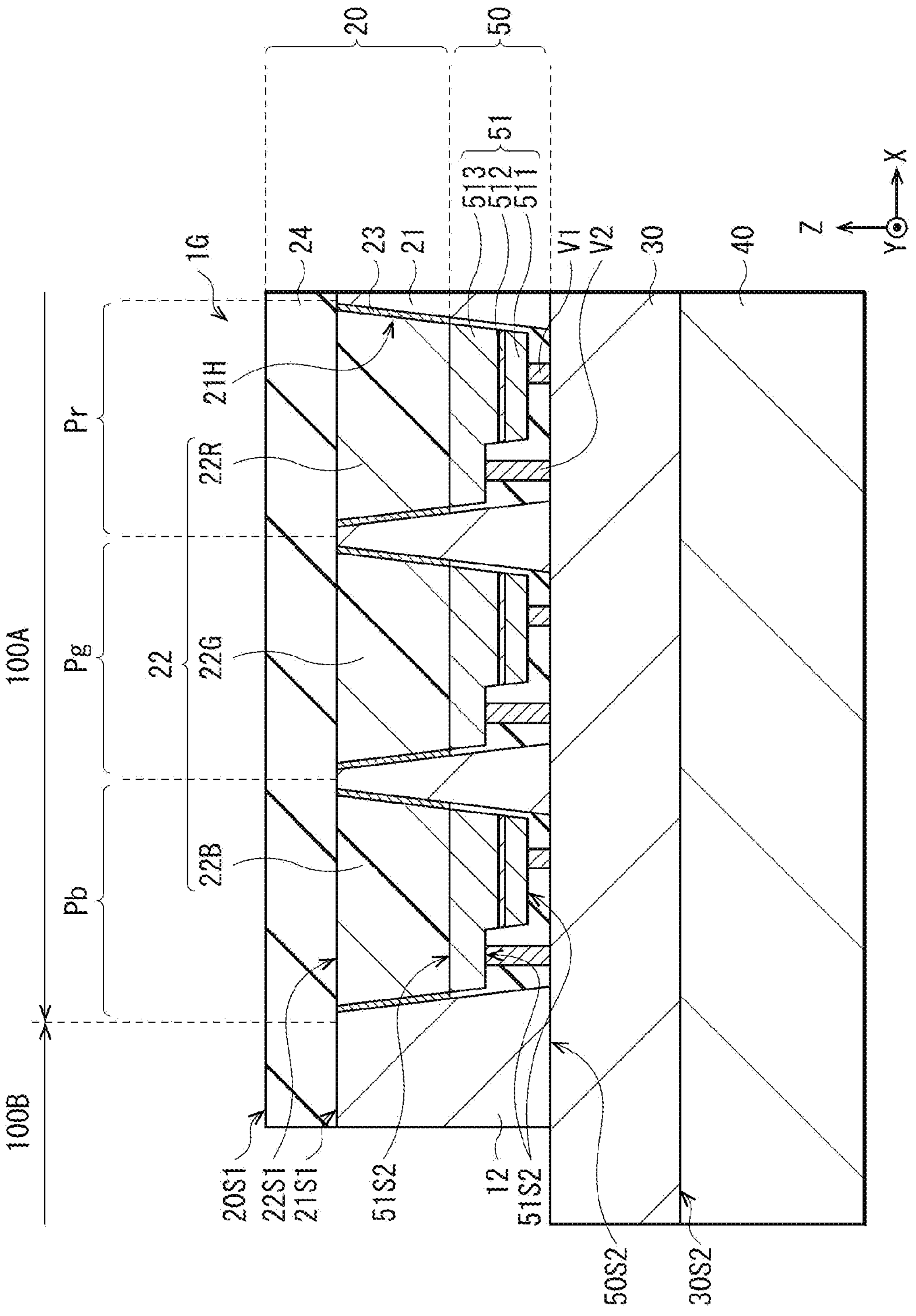
FIG. 14 is a schematic cross-sectional diagram illustrating an example of a configuration of a light-emitting device according to a seventh modification example of the present disclosure.

FIG. 14 schematically illustrates an example of a cross-sectional configuration of a light-emitting device (a light-emitting device 1G) according to a seventh modification example of the present disclosure. The light-emitting device 1G is suitably applicable to a display section of an image display apparatus (the image display apparatus 100) which is a so-called LED display as in the above-described embodiment. The light-emitting device 1G of the present modification example differs from the above-described sixth modification example in that the partition wall 21 penetrates to the circuit substrate 30 and the light-emitting section 50 and the wavelength conversion section 20 are collectively formed.

The light-emitting device 1G of the present modification example is manufacturable, for example, as follows. FIGS. 15A to 15I illustrate an exemplary manufacturing process of the light-emitting device 1G.

Figure 15A:
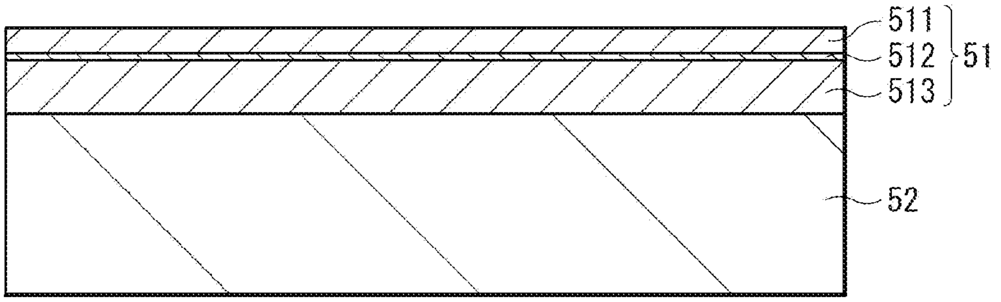
FIG. 15A is a schematic cross-sectional diagram illustrating a manufacturing process of the light-emitting device illustrated in FIG. 14.
Figure 15B:
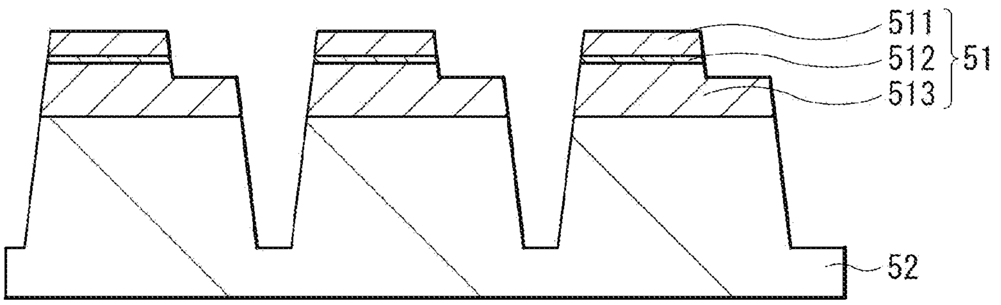
FIG. 15B is a schematic cross-sectional diagram illustrating a step following FIG. 15A.

First, as illustrated in FIG. 15A, the first conductivity type layer 511, the active layer 512, and the second conductivity type layer 513 are formed on a growth substrate 52 by an epitaxial crystalline growth method using, for example, a metal-organic vapor deposition (MOCVD) method, a molecular beam epitaxy (MBE) method, or the like. Subsequently, as illustrated in FIG. 15B, for example, the first conductivity type layer 511, the active layer 512, the second conductivity type layer 513, and the growth substrate 52 are separated by photolithography and etching, the plurality of light-emitting elements 51 having a mesa structure are cut out, and further, electrodes are formed on the first conductivity type layer 511 and the second conductivity type layer 513.

Figure 15C:
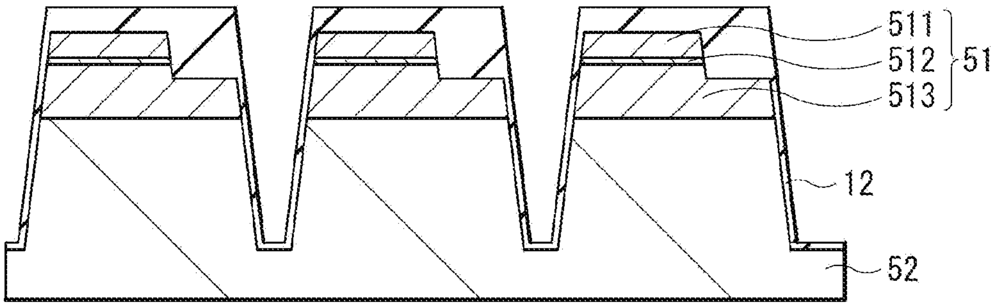
FIG. 15C is a schematic cross-sectional diagram illustrating a step following FIG. 15B.
Figure 15D:
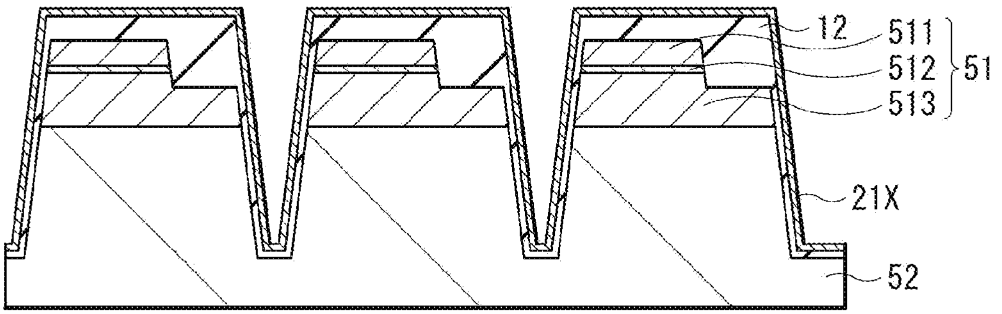
FIG. 15D is a schematic cross-sectional diagram illustrating a step following FIG. 15C.

Next, as illustrated in FIG. 15C, an unevenness on the surface 50S2 side of the light-emitting element 51 is buried, and the insulating layer 12 covering a side surface of the light-emitting element 51, and a side surface and a bottom surface of the growth substrate 52 are formed. Subsequently, as illustrated in FIG. 15D, the seed layer 21X that includes, for example, Cu is formed on the insulating layer 12 by, for example, sputtering.

Figure 15E:
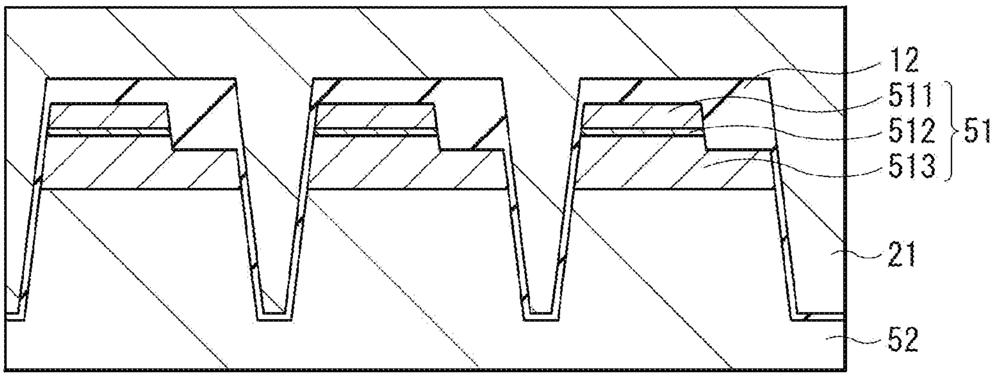
FIG. 15E is a schematic cross-sectional diagram illustrating a step following FIG. 15D.
Figure 15F:
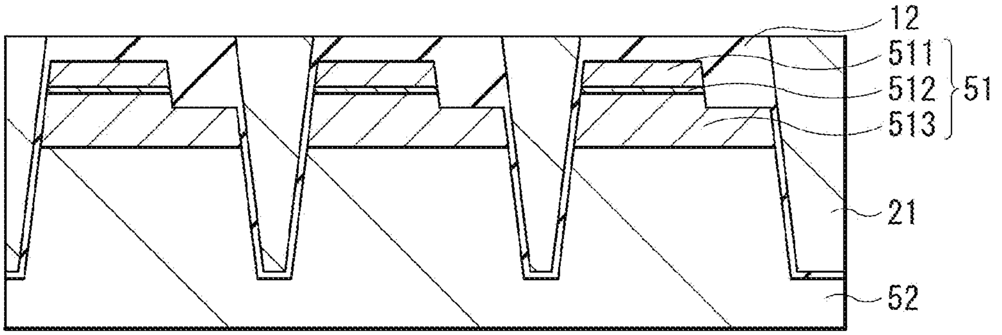
FIG. 15F is a schematic cross-sectional diagram illustrating a step following FIG. 15E.
Figure 15G:
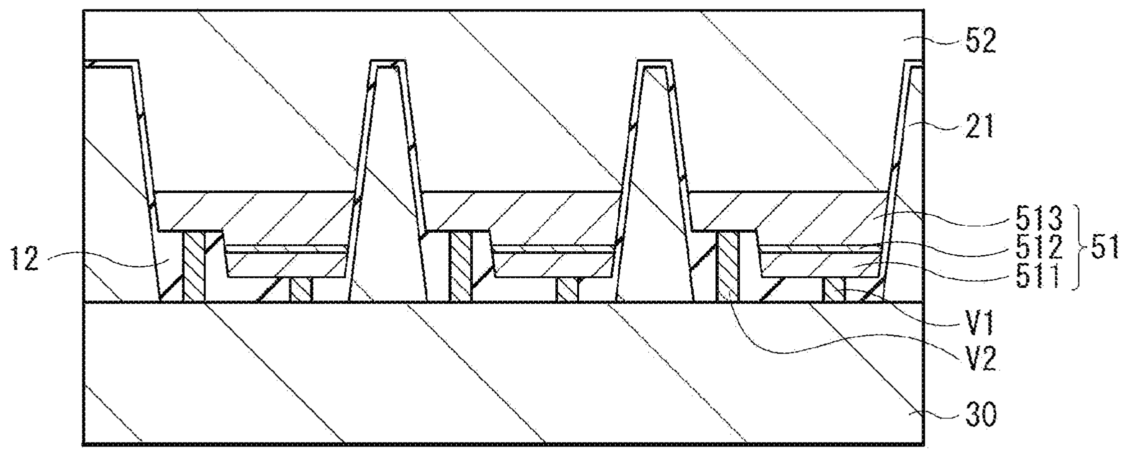
FIG. 15G is a schematic cross-sectional diagram illustrating a step following FIG. 15F.

Next, as illustrated in FIG. 15E, a Cu film to be the partition wall 21 is formed on the seed layer 21X by, for example, electrolytic plating. Subsequently, as illustrated in FIG. 15F, the Cu film formed on the light-emitting element 51 is removed by CMP, for example, to expose the insulating layer 12 provided on the light-emitting element 51. Next, as illustrated in FIG. 15G, the vias V1 and V2 coupled to the electrodes provided on the first conductivity type layer 511 and the second conductivity type layer 513 are formed, and then the circuit substrate 30 is bonded to the surface 50S2 of the light-emitting section 50.

Figure 15H:
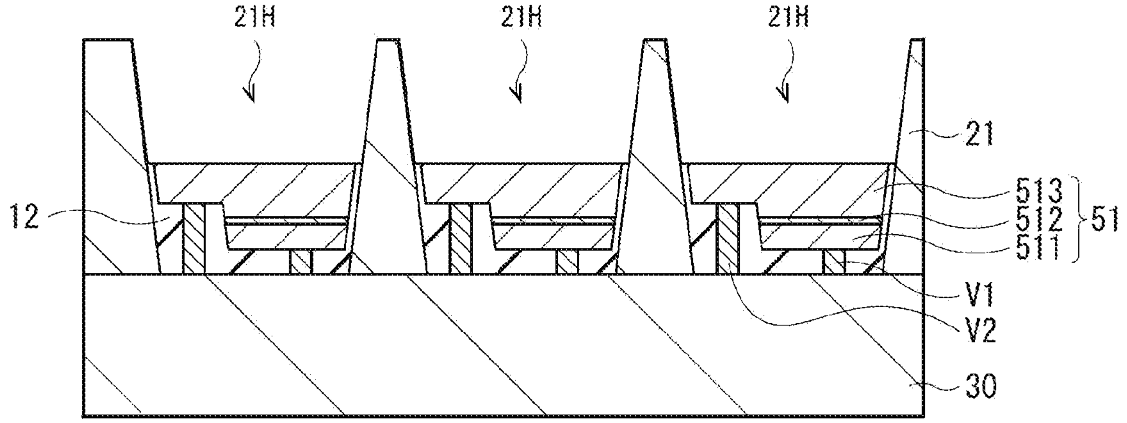
FIG. 15H is a schematic cross-sectional diagram illustrating a step following FIG. 15G.
Figure 15I:
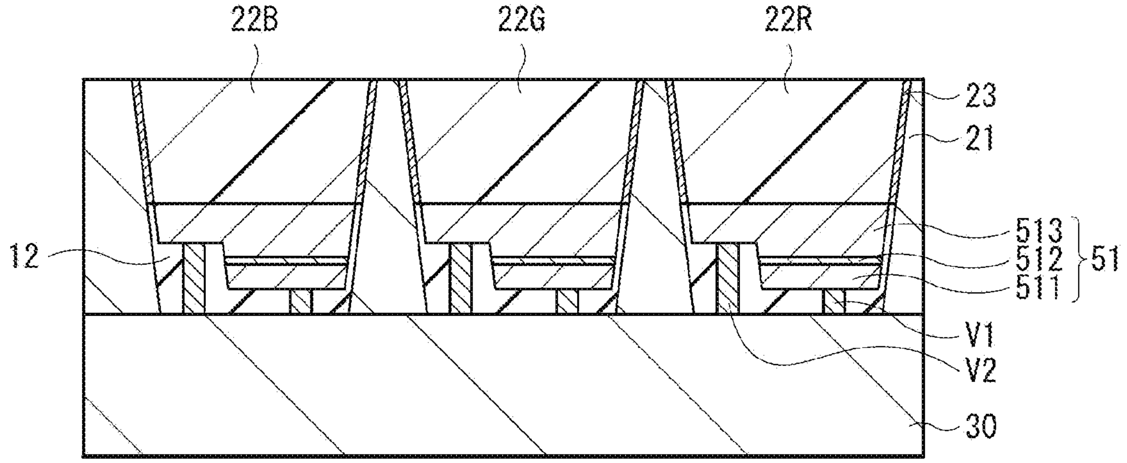
FIG. 15I is a schematic cross-sectional diagram illustrating a step following FIG. 15H.

Subsequently, as illustrated in FIG. 15H, the growth substrate 52 is removed by, for example, etching to form the opening 21H, and then the light reflection film 23 is formed on a side surface of the opening 21H. Next, as illustrated in FIG. 15I, the wavelength conversion layer 22 is formed in the opening 21H by, for example, a coating method. Thereafter, the protective layer 24 is formed on the partition wall 21 and the wavelength conversion layer 22, and then the heat dissipation member 40 is bonded to the surface 30S2 of the circuit substrate 30. Thus, the light-emitting device 1G illustrated in FIG. 14 is completed.

As described above, in the present modification example, the light-emitting section 50 and the wavelength conversion section 20 are collectively formed to cause the partition wall 21 to be directly in contact with the circuit substrate 30. As a result, it is possible for the partition wall 21 to exhaust a heat of the light-emitting element 51 in addition to the heat exhausted from the wavelength conversion layer 22. Therefore, in addition to the effects of the above-described embodiments and the like, it is possible to improve a light-emission efficiency of the light-emitting element 51. Further, in the light-emitting device 1G of the present modification example, an optical coupling property between the light-emitting element 51 and the wavelength conversion layer 22 is high, and an optical loss due to leakage light from both interfaces is small. Therefore, it is possible to further improve the display quality.

2-8. Eighth Modification Example

Figure 16:
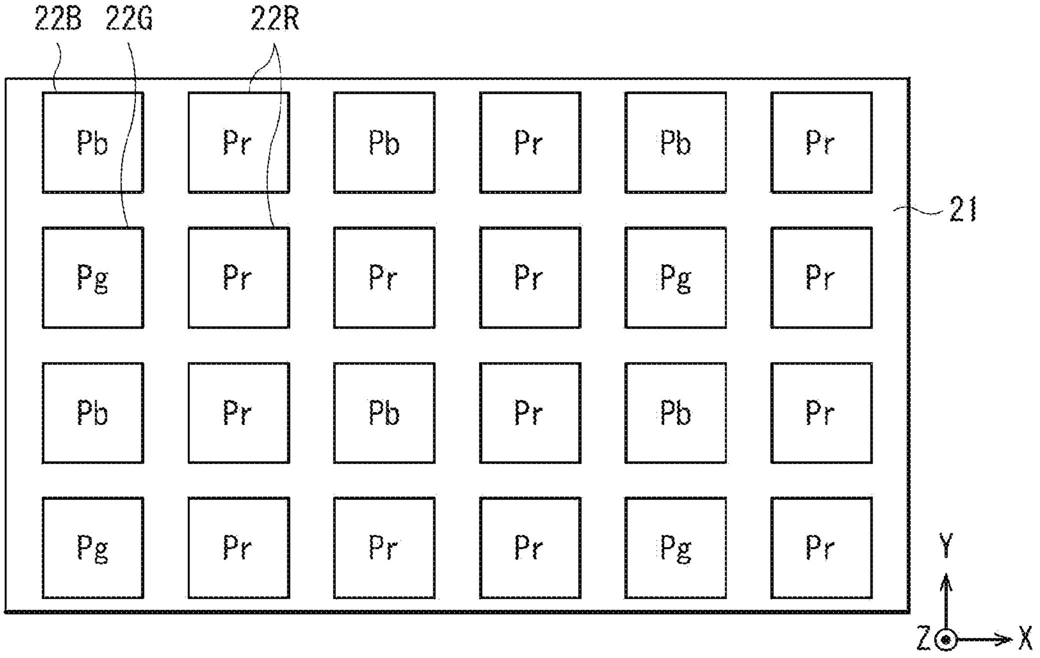
FIG. 16 is a schematic plan diagram illustrating an example of a layout of a wavelength conversion layer in a light-emitting device according to an eighth modification example of the present disclosure.
Figure 17:
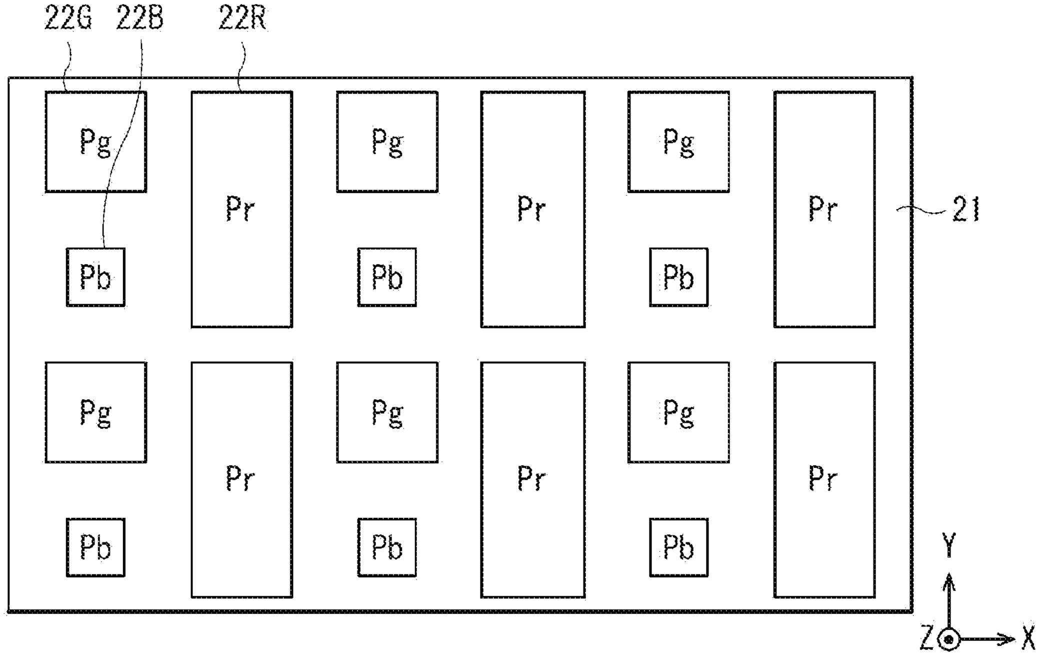
FIG. 17 is a schematic plan diagram illustrating another example of the layout of the wavelength conversion layer in the light-emitting device according to the eighth modification example of the present disclosure.

In the above-described embodiment and the like, the partition wall 21 has the opening 21H having a substantially regular hexagonal shape for each of the color pixels Pr, Pg, and Pb, but a planar shape of the opening 21H is not limited thereto. For example, as illustrated in FIG. 16, a rectangular opening 21H may be provided. In this case, the plurality of light-emitting elements 11 and the opening 21H may be two-dimensionally arranged in a matrix, for example. In addition, sizes of the openings 21H do not necessarily have to be the same. For example, as illustrated in FIG. 17, the size of the opening 21H (the wavelength conversion layer 22 (22R, 22G, and 22B)) may be changed for each of the color pixels Pr, Pg, and Pb, for example, as with the fifth modification example.

3. APPLICATION EXAMPLES

Application Example 1

Figure 18:
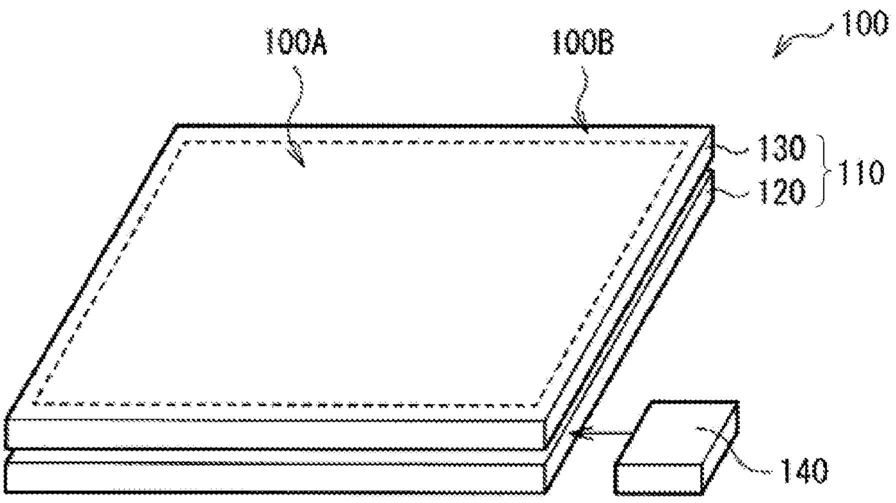
FIG. 18 is a perspective diagram illustrating an example of a configuration of an image display apparatus according to an application example of the present disclosure.

FIG. 18 is a perspective diagram illustrating an example of a schematic configuration of an image display apparatus (the image display apparatus 100). The image display apparatus 100 is a so-called LED display, and a light-emitting device (for example, the light-emitting device 1) of the present disclosure is used as a display pixel. As illustrated in FIG. 18, for example, the image display apparatus 100 includes a display panel 110 and a control circuit 140 that drives the display panel 110.

The display panel 110 is a display panel in which a mounting substrate 120 and a counter substrate 130 are superimposed on each other. A surface of the counter substrate 130 serves as a picture display surface, and has a display region (a display section 110A) at a middle portion thereof, and a frame section 110B which is a non-display region is provided around the display region.

Figure 19:
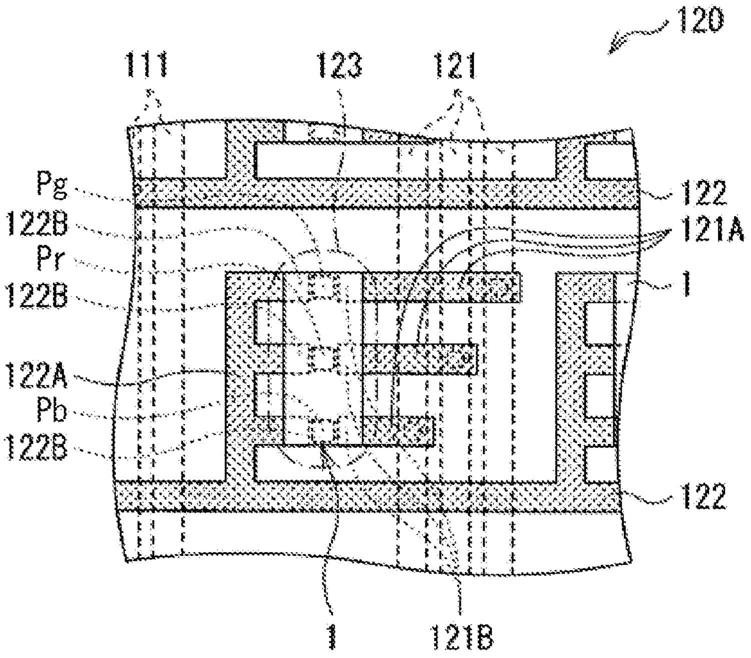
FIG. 19 is a schematic diagram illustrating an example of a wiring line layout of the image display apparatus illustrated in FIG. 18.

FIG. 19 is a diagram illustrating an exemplary wiring line layout of a region corresponding to the display section 110A on the counter substrate 130 side of the mounting substrate 120. As illustrated in FIG. 19, for example, a plurality of data wiring lines 121 is formed to extend in a predetermined direction and is arranged in parallel at a predetermined pitch in a region corresponding to the display section 110A of a surface of the mounting substrate 120. In a region of the mounting substrate 120 corresponding to the display section 110A, for example, a plurality of scan wiring lines 122 is formed to extend in a direction intersecting (for example, orthogonal to) the data wiring lines 121, and is arranged in parallel at a predetermined pitch. The data wiring line 121 and the scan wiring line 122 include, for example, a conductive material such as Cu.

The scan wiring line 122 is formed on, for example, an outermost layer, and is formed on, for example, an insulating layer (not illustrated) formed on a surface of a base material. The base material of the mounting substrate 120 is configured by, for example, a silicon substrate, a resin substrate, or the like, and the insulating layer on the base material includes, for example, SiN, SiO, aluminum oxide (AlO), or a resin material. On the other hand, the data wiring line 121 is formed in a layer (for example, a layer lower than the outermost layer) different from the outermost layer that includes the scan wiring line 122, and is formed in, for example, the insulating layer on the base material.

Near an intersection of the data wiring line 121 and the scan wiring line 122 is a display pixel 123, and a plurality of display pixels 123 is arranged in a matrix in the display section 110A. For example, each color pixel Pr, Pg, and Pb of the light-emitting device 1 is mounted on each of the display pixels 123.

In the light-emitting device 1, for example, a pair of terminal electrodes are provided for each color pixel Pr, Pg, and Pb, or a pair of terminal electrodes are provided in which one of the pair of terminal electrodes is commonly provided for each color pixel Pr, Pg, and Pb and the other of the pair of terminal electrodes is provided for each color pixel Pr, Pg, and Pb. One terminal electrode is electrically coupled to the data wiring line 121, and the other terminal electrode is electrically coupled to the scan wiring line 122. For example, one terminal electrode is electrically coupled to a pad electrode 121B at a distal end of a branch 121A provided at the data wiring line 121. Further, for example, the other terminal electrode is electrically coupled to a pad electrode 122B at a distal end of a branch 122A provided at the scan wiring line 122.

Each of the pad electrodes 121B and 122B is formed, for example, on the outermost layer, and is provided, for example, in a portion where each light-emitting device 1 is mounted, as illustrated in FIG. 19. Here, each of the pad electrodes 121B and 122B includes an electrically conductive material such as Au (gold).

The mounting substrate 120 is further provided with, for example, a plurality of support columns (not illustrated) that regulates a distance between the mounting substrate 120 and the counter substrate 130. The support column may be provided in a region opposed to the display section 110A or may be provided in a region opposed to the frame section 110B.

The counter substrate 130 includes, for example, a glass substrate or a resin substrate. In the counter substrate 130, a surface on the light-emitting device 1 side may be flat, but is preferably rough. The rough surface may be provided over the entire region opposed to the display section 110A, or may be provided only in a region opposed to the display pixel 123. The rough surface has fine irregularities in which the pieces of light emitted from the color pixels Pr, Pg, and Pb enter the rough surface. It is possible to fabricate the irregularities of the rough surface by, for example, sand blasting, dry etching, or the like.

The control circuit 140 drives each display pixel 123 (each light-emitting device 1) on the basis of on a picture signal. The control circuit 140 includes, for example, a data driver that drives the data wiring line 121 coupled to the display pixel 123 and a scan driver that drives the scan wiring line 122 coupled to the display pixel 123. For example, as illustrated in FIG. 18, the control circuit 140 may be provided separately from the display panel 110 and coupled to the mounting substrate 120 via a wiring line, or may be mounted on the mounting substrate 120.

Application Example 2

Figure 20:
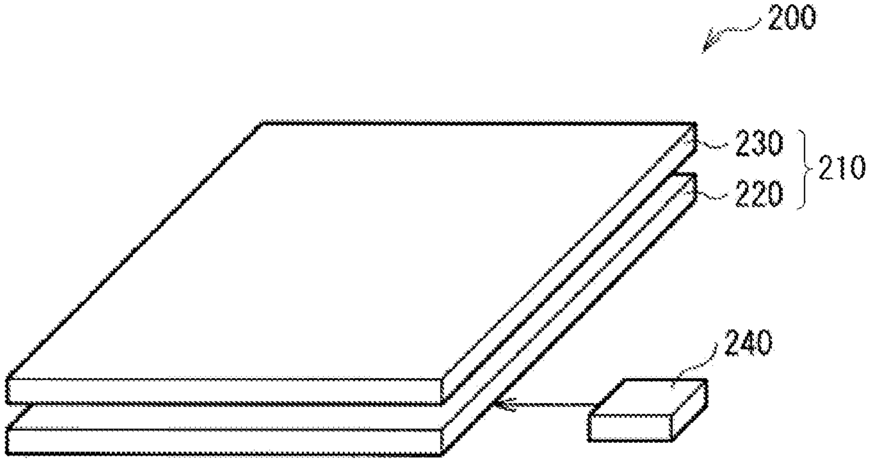
FIG. 20 is a perspective diagram illustrating an example of a configuration of an image display apparatus according to an application example of the present disclosure.

FIG. 20 is a perspective diagram illustrating another configuration example of the image display apparatus (an image display apparatus 200) using a light-emitting device (for example, the light-emitting device 1) of the present disclosure. The image display apparatus 200 is a so-called tiling display that uses a plurality of light-emitting devices in which LEDs are used as light sources. For example, as illustrated in FIG. 20, the image display apparatus 200 includes a display panel 210 and a control circuit 240 that drives the display panel 210.

The display panel 210 is a display panel in which a mounting substrate 220 and a counter substrate 230 are superimposed on each other. A surface of the counter substrate 230 serves as a picture display surface, and has a display section at a middle portion thereof, and a frame section which is a non-display region is provided around the display section (neither of which is illustrated). The counter substrate 230 is disposed, for example, at a position opposed to the mounting substrate 220 with a predetermined gap therebetween. The counter substrate 230 may be in contact with an upper surface of the mounting substrate 220.

Figure 21:
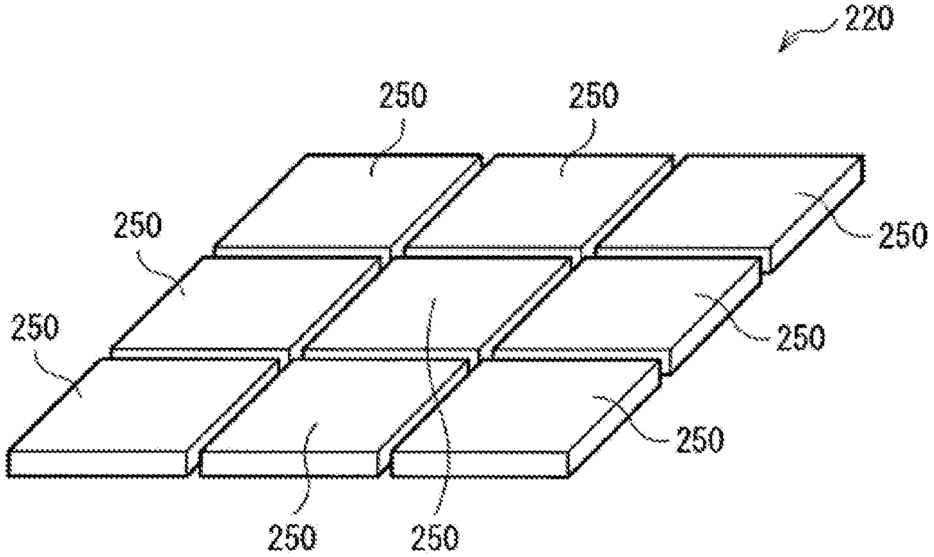
FIG. 21 is a perspective diagram illustrating a configuration of a mounting substrate illustrated in FIG. 20.

FIG. 21 schematically illustrates an example of a configuration of the mounting substrate 220. For example, as illustrated in FIG. 21, the mounting substrate 220 includes a plurality of unit substrates 250 laid in a tile shape. Although FIG. 21 illustrates an example in which the mounting substrate 220 is configured by nine unit substrates 250, the number of unit substrates 250 may be 10 or more or 8 or less.

Figure 22:
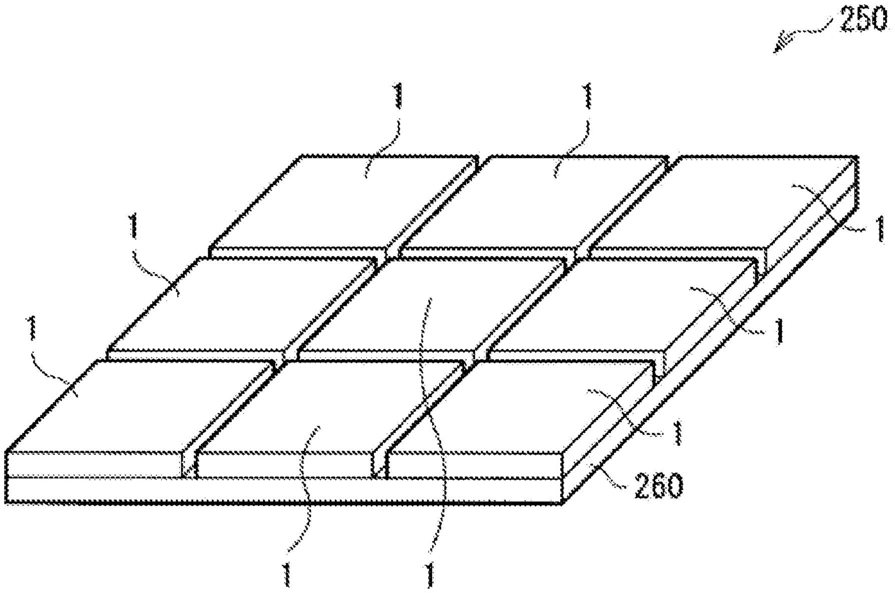
FIG. 22 is a perspective diagram illustrating a configuration of a unit substrate illustrated in FIG. 21.

FIG. 22 illustrates an example of a configuration of the unit substrate 250. The unit substrate 250 includes, for example, a plurality of light-emitting devices 1 laid in tiles, and a support substrate 260 that supports the light-emitting devices 1. The unit substrate 250 further includes a control substrate (not illustrated). The support substrate 260 includes, for example, a metal frame (a metal plate), a wiring substrate, or the like. In a case where the support substrate 260 is configured by the wiring substrate, the support substrate 260 may also serve as a control substrate. At this time, at least one of the support substrate 260 or the control substrate is electrically coupled to each of the light-emitting devices 1.

Application Example 3

Figure 23:
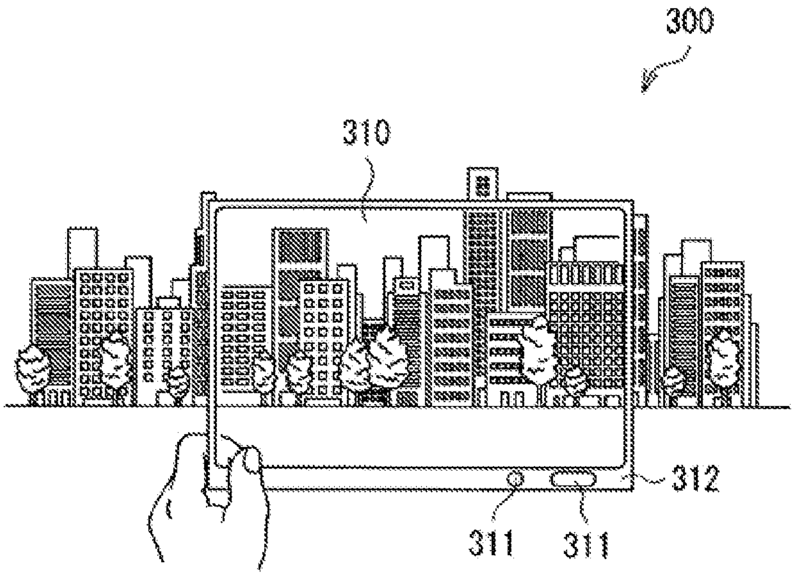
FIG. 23 is a diagram illustrating an example of an image display apparatus according to an application example of the present disclosure.

FIG. 23 illustrates an appearance of a transparent display 300. The transparent display 300 includes, for example, a display unit 310, an operation unit 311, and a housing 312. A light-emitting device of the present disclosure (for example, the light-emitting device 1) is used for the display unit 310. The transparent display 300 is able to display an image and character information while allowing the background of the display unit 310 to transmit therethrough.

In the transparent display 300, a substrate having light transparency is used as a mounting substrate. Each electrode provided in the light-emitting device 1 is formed using an electrically conductive material having light transparency as in a case of the mounting substrate. Alternatively, each electrode has a structure that is difficult to be visually recognized by supplementing a wiring line width or reducing a thickness of a wiring line. Further, the transparent display 300 is able to perform black display by superimposing, for example, a liquid crystal layer including a driving circuit, and is able to perform switching between transmittance and black display by controlling a light distribution direction of liquid crystals.

Although the present technology has been described with reference to the embodiments, the first to the eighth modification examples, and the application example, the present technology is not limited to the above-described embodiment and the like, and various modification examples are possible. For example, in the above-described embodiments and the like, an example in which the light outputted from the light-emitting element 11 is blue light or ultraviolet light has been described, but it is not limited thereto. For example, in the light-emitting device 1, it is also possible to use a light-emitting element in which two or more kinds of light such as blue light and green light or ultraviolet light and green light are outputted.

Further, in the above-described embodiments and the like, the respective members configuring the light-emitting device 1, etc., have been specifically described, but it is not necessary to include all the members, and other members may be further provided. For example, in a case where the partition wall 21 is directly laminated on the electrode layer 13 and where the partition wall 21 and the wiring line 14 are electrically coupled via the through wiring line 15, the through wiring line 15 that electrically couples the electrode layer 13 and the wiring line 14 may be omitted.

It is to be noted that the effects described in the present specification are mere examples and description thereof is non-limiting. Other effects may be also provided.

The present technology may have the following configuration. According to the present technology having the following configurations, a partition wall that is disposed above a plurality of light-emitting elements arranged in an array and separates a wavelength conversion layer that converts a wavelength of light outputted from the plurality of light-emitting elements for each of the light-emitting elements is formed using a metal material. This suppresses a temperature increase of the wavelength conversion layer. Therefore, it is possible to improve display quality.

(1)

A light-emitting device including:

a substrate having a first surface and a second surface that are opposed to each other;

a plurality of light-emitting elements arranged in an array on the first surface side of the substrate;

a partition wall formed above the plurality of light-emitting elements using a metal material and having an opening for each of the plurality of light-emitting elements; and a wavelength conversion layer that is provided in the opening and converts a wavelength of light outputted from the plurality of light-emitting elements.

(2)

The light-emitting device according to (1), further including:

an array section in which the plurality of light-emitting elements is arranged in the array; and an outer peripheral section provided around the array section, in which the partition wall is coupled to the substrate at the outer peripheral section.

(3)

The light-emitting device according to (1), further including:

an array section in which the plurality of light-emitting elements is arranged in the array; and an outer peripheral section provided around the array section, in which the partition wall is coupled to the substrate for each of one or the plurality of light-emitting elements in the array section.

(4)

The light-emitting device according to any one of (1) to (3), further including an electrode layer that is common to the plurality of light-emitting elements and provided between the plurality of light-emitting elements and the partition wall and between the plurality of light-emitting elements and the wavelength conversion layer, in which the partition wall is electrically coupled to the electrode layer.

(5)

The light-emitting device according to any one of (1) to (4), in which the partition wall further includes a light reflection film on a side surface of the opening.

(6)

The light-emitting device according to any one of (1) to (5), in which the partition wall further includes a dielectric film on a side surface of the opening.

(7)

The light-emitting device according to any one of (1) to (6), in which the partition wall further extends between the plurality of light-emitting elements adjacent to each other, and the plurality of light-emitting elements and the wavelength conversion layer are integrated by the partition wall.

(8)

The light-emitting device according to any one of (1) to (6), in which the partition wall has a laminated structure of a first partition wall formed using a semiconductor material and a second partition wall formed using the metal material, and the first partition wall and the second partition wall are laminated in this order from the substrate side.

(9)

The light-emitting device according to (8), in which the first partition wall further includes an insulating film that is continuous with a side surface configuring the opening and an upper surface opposed to the second partition wall.

(10)

The light-emitting device according to (8) or (9), in which a first inclination angle of a first side surface of the first partition wall configuring the opening with respect to the first surface of the substrate is smaller than a second inclination angle of a second side surface of the second partition wall configuring the opening with respect to the first surface of the substrate.

(11)

The light-emitting device according to any one of (1) to (10), in which the light-emitting element includes a first light-emitting element, a second light-emitting element, and a third light-emitting element that output first light, the wavelength conversion layer includes a first wavelength conversion layer disposed above the first light-emitting element, a second wavelength conversion layer disposed above the second light-emitting element, and a third wavelength conversion layer disposed above the third light-emitting element, the first wavelength conversion layer converts the first light into red light, the second wavelength conversion layer converts the first light into green light, and the third wavelength conversion layer allows the first light to transmit therethrough or converts the first light into blue light.

(12)

The light-emitting device according to (11), in which widths of the openings in which the first wavelength conversion layer, the second wavelength conversion layer, and the third wavelength conversion layer are provided are different from each other.

(13)

The light-emitting device according to any one of (1) to (12), in which the wavelength conversion layer is formed using a plurality of quantum dots.

(14)

The light-emitting device according to any one of (11) to (13), in which the third wavelength conversion layer is configured by a resin layer having light transparency.

(15)

The light-emitting device according to any one of (1) to (14), in which the light-emitting element includes a light-emitting diode having an emission wavelength in a blue band or an ultraviolet region.

(16)

The light-emitting device according to any one of (1) to (15), further including a heat dissipation member disposed on the second surface of the substrate.

(17)

An image display apparatus that includes a light-emitting device, the light-emitting device including:

a substrate having a first surface and a second surface that are opposed to each other;

a plurality of light-emitting elements arranged in an array on the first surface side of the substrate;

a partition wall formed above the plurality of light-emitting elements using a metal material and having an opening for each of the plurality of light-emitting elements; and a wavelength conversion layer that is provided in the opening and converts a wavelength of light outputted from the plurality of light-emitting elements.

The present application claims the benefit of Japanese Priority Patent Application JP2021-082674 filed with the Japan Patent Office on May 14, 2021, the entire contents of which are incorporated herein by reference.

It should be understood by those skilled in the art that various modification examples, combinations, sub-combinations and alterations may occur depending on design requirements and other factors insofar as they are within the scope of the appended claims or the equivalents thereof.

What is claimed is:

1. A light-emitting device, comprising:

a substrate having a first surface and a second surface that are opposed to each other;

a plurality of light-emitting elements arranged in an array on the first surface side of the substrate;

a partition wall formed above the plurality of light-emitting elements using a metal material and having an opening for each of the plurality of light-emitting elements; and a wavelength conversion layer that is provided in the opening and converts a wavelength of light outputted from the plurality of light-emitting elements, wherein the partition wall has a laminated structure of a first partition wall formed using a semiconductor material and a second partition wall formed using the metal material, and wherein the first partition wall and the second partition wall are laminated in this order from the substrate side.

2. The light-emitting device according to claim 1, further comprising:

an array section in which the plurality of light-emitting elements is arranged in the array; and an outer peripheral section provided around the array section, wherein the partition wall is coupled to the substrate at the outer peripheral section.

3. The light-emitting device according to claim 1, further comprising:

an array section in which the plurality of light-emitting elements is arranged in the array; and an outer peripheral section provided around the array section, wherein the partition wall is coupled to the substrate for each of one or the plurality of light-emitting elements in the array section.

4. The light-emitting device according to claim 1, further comprising an electrode layer that is common to the plurality of light-emitting elements and provided between the plurality of light-emitting elements and the partition wall and between the plurality of light-emitting elements and the wavelength conversion layer, wherein the partition wall is electrically coupled to the electrode layer.

5. The light-emitting device according to claim 1, wherein the partition wall further includes a light reflection film on a side surface of the opening.

6. The light-emitting device according to claim 1, wherein the partition wall further includes a dielectric film on a side surface of the opening.

7. The light-emitting device according to claim 1, wherein the first partition wall further includes an insulating film that is continuous with a side surface configuring the opening and an upper surface opposed to the second partition wall.

8. The light-emitting device according to claim 1, wherein a first inclination angle of a first side surface of the first partition wall configuring the opening with respect to the first surface of the substrate is smaller than a second inclination angle of a second side surface of the second partition wall configuring the opening with respect to the first surface of the substrate.

9. The light-emitting device according to claim 1, wherein the light-emitting element comprises a first light-emitting element, a second light-emitting element, and a third light-emitting element that output first light, the wavelength conversion layer comprises a first wavelength conversion layer disposed above the first light-emitting element, a second wavelength conversion layer disposed above the second light-emitting element, and a third wavelength conversion layer disposed above the third light-emitting element, the first wavelength conversion layer converts the first light into red light, the second wavelength conversion layer converts the first light into green light, and the third wavelength conversion layer allows the first light to transmit therethrough or converts the first light into blue light.

10. The light-emitting device according to claim 9, wherein widths of the openings in which the first wavelength conversion layer, the second wavelength conversion layer, and the third wavelength conversion layer are provided are different from each other.

11. The light-emitting device according to claim 10, wherein the partition wall further extends between the plurality of light-emitting elements adjacent to each other, and the plurality of light-emitting elements and the wavelength conversion layer are integrated by the partition wall.

12. The light-emitting device according to claim 9, wherein the third wavelength conversion layer is configured by a resin layer having light transparency.

13. The light-emitting device according to claim 1, wherein the wavelength conversion layer is formed using a plurality of quantum dots.

14. The light-emitting device according to claim 1, wherein the light-emitting element comprises a light-emitting diode having an emission wavelength in a blue band or an ultraviolet region.

15. The light-emitting device according to claim 1, further comprising a heat dissipation member disposed on the second surface of the substrate.

16. An image display apparatus that includes a light-emitting device, the light-emitting device comprising:

a substrate having a first surface and a second surface that are opposed to each other;

a plurality of light-emitting elements arranged in an array on the first surface side of the substrate;

a partition wall formed above the plurality of light-emitting elements using a metal material and having an opening for each of the plurality of light-emitting elements; and a wavelength conversion layer that is provided in the opening and converts a wavelength of light outputted from the plurality of light-emitting elements, wherein the partition wall has a laminated structure of a first partition wall formed using a semiconductor material and a second partition wall formed using the metal material, and wherein the first partition wall and the second partition wall are laminated in this order from the substrate side.

17. A light-emitting device, comprising:

a substrate having a first surface and a second surface that are opposed to each other;

a plurality of light-emitting elements arranged in an array on the first surface side of the substrate;

a partition wall formed above the plurality of light-emitting elements using a metal material and having an opening for each of the plurality of light-emitting elements; and a wavelength conversion layer that is provided in the opening and converts a wavelength of light outputted from the plurality of light-emitting elements, wherein the light-emitting element comprises a first light-emitting element, a second light-emitting element, and a third light-emitting element that output first light, wherein the wavelength conversion layer comprises a first wavelength conversion layer disposed above the first light-emitting element, a second wavelength conversion layer disposed above the second light-emitting element, and a third wavelength conversion layer disposed above the third light-emitting element, wherein the first wavelength conversion layer converts the first light into red light, wherein the second wavelength conversion layer converts the first light into green light, wherein the third wavelength conversion layer allows the first light to transmit therethrough or converts the first light into blue light, and wherein widths of the openings in which the first wavelength conversion layer, the second wavelength conversion layer, and the third wavelength conversion layer are provided are different from each other.

18. The light-emitting device according to claim 17, further comprising:

an array section in which the plurality of light-emitting elements is arranged in the array; and an outer peripheral section provided around the array section, wherein the partition wall is coupled to the substrate at the outer peripheral section.

19. The light-emitting device according to claim 17, further comprising:

an array section in which the plurality of light-emitting elements is arranged in the array; and an outer peripheral section provided around the array section, wherein the partition wall is coupled to the substrate for each of one or the plurality of light-emitting elements in the array section.

20. The light-emitting device according to claim 17, further comprising an electrode layer that is common to the plurality of light-emitting elements and provided between the plurality of light-emitting elements and the partition wall and between the plurality of light-emitting elements and the wavelength conversion layer, wherein the partition wall is electrically coupled to the electrode layer.

* * * * *